United States Patent [19]
Katagiri et al.

[11] Patent Number: 5,408,320
[45] Date of Patent: Apr. 18, 1995

[54] WORKPIECE HAVING ALIGNMENT MARKS FOR POSITIONING A PATTERN AT A DIFFERENT PITCH TO BE FORMED THEREON, AND METHOD FOR FABRICATING THE SAME

[75] Inventors: Soichi Katagiri, Hachiohji; Shigeo Moriyama, Tama; Tsuneo Terasawa, Ohme; Masaaki Itou, Higashimurayama, all of Japan

[73] Assignee: Hitachi, Ltd., Tokyo, Japan

[21] Appl. No.: 994,963

[22] Filed: Dec. 22, 1992

Related U.S. Application Data

[62] Division of Ser. No. 734,159, Jul. 22, 1991, Pat. No. 5,200,798.

[30] Foreign Application Priority Data

Jul. 23, 1990 [JP] Japan ................................. 2-192946

[51] Int. Cl.⁶ ................................................ G01B 9/02
[52] U.S. Cl. ...................... 356/363; 356/401; 356/356
[58] Field of Search ............... 356/354, 355, 356, 363, 356/400, 401

[56] References Cited

U.S. PATENT DOCUMENTS

| 4,952,060 | 8/1990 | Ina et al. | 356/401 |
| 5,127,733 | 7/1992 | Allgauga | 356/356 |
| 5,200,798 | 4/1993 | Katagiri et al. | 356/363 |

*Primary Examiner*—Samuel A. Turner
*Attorney, Agent, or Firm*—Fay, Sharpe, Beall, Fagan, Minnich & McKee

[57] ABSTRACT

A semiconductor wafer includes a top surface on which a semiconductor circuit pattern is to be fabricated, and a bottom surface on which alignment marks for positioning the semiconductor circuit pattern are arranged. The alignment marks are arranged at a predetermined pitch and in an arrangement that is not unique to the pattern formed on the top surface.

14 Claims, 19 Drawing Sheets

WORKPIECE HAVING ALIGNMENT MARKS FOR POSITIONING A PATTERN AT A DIFFERENT PITCH TO BE FORMED THEREON, AND METHOD FOR FABRICATING THE SAME

This application is a divisional application of Ser. No. 07/734,159, filed Jul. 22, 1991, and now U.S. Pat. No. 5,200,798.

BACKGROUND OF THE INVENTION:

The present invention relates to improvements in the method of semiconductor production and in the apparatus for implementing that method. More specifically, the invention relates to a method of position detection and to a method and apparatus of printing miniature patterns by use of that position detection method, the latter method and apparatus being used illustratively in X-ray exposure systems, steppers and electron beam lithography systems to improve their alignment accuracy.

To print miniature patterns such as a semiconductor integrated circuit with lithography techniques (e.g., reduction projection, x-ray exposure, electron beam lithography) requires accurately detecting the position of a sample placed on the sample stage and then aligning the sample precisely with a reticle or the like. Along with a growing demand in recent, years for higher density in semiconductor devices has come the increasing need for higher overlay accuracy. Today, the overlay accuracy is required to be as high as 0.05 $\mu$m or less in error.

The alignment between sample and reticle generally involves the use of position detection marks on the top surface St (this and other reference character are identified in the accompanying drawings) of the sample (i.e., the surface on which patterns are printed). In that case, there exist limits to improving the overlay accuracy, because there may occur an alignment error attributable to resist coating irregularities or a damaged position detection mark. This disadvantage appears to have been circumvented by a method, proposed in Japanese Patent Laid-Open No. 55-46053, whereby position detection marks are provided on the bottom surface Sb of the sample (i.e., on the surface on which patterns are not printed). Some other method, such as one n Japanese Patent Laid-Open No. 63-160722 and another in Japanese Patent Laid-Open No. 63-224327, also utilize the marks on the sample bottom surface Sb for alignment. These methods involve detecting the positions of position detection marks on the sample bottom surface Sb and, in alignment with those mark positions, printing the corresponding patterns on the top surface St of the sample.

The method of detecting the mark positions on the sample bottom surface Sb poses new problems that need to be solved, illustratively when an overlay accuracy level of 0.03 $\mu$m required of devices since the 0.2 $\mu$m rule is to be achieved. That is, those error factors that used to be ignored without adverse effects become no longer negligible. When the sample tilts and its surface causes misalignment with a reference surface, the thickness of the sample generates a difference between the mark-bearing bottom surface Sb and the top surface St on which to print patterns. That difference leads to a detection error that cannot be ignored when the overlay accuracy is 0.03 $\mu$m.

One conventional way to correct the detection error is to install a tilt detection optical system that detects the tilt angle of the sample. One disadvantage of this solution is that adding the tilt detection optics makes the manufacturing equipment larger and more complicated. Thus the development of a position detection method has been desired which would detect marks formed on the sample bottom surface, with no use of the tilt detection optics, in order to readily correct the position error attributable to a tilt of the sample. Because of its location, the detector for detecting the bottom surface marks would need to be embedded in the stage that bears the sample. This turn would require the detector to be sufficiently small in size. These requirements have not been met successfully with the prior art.

In a setup where mark positions are detected from the bottom surface of the sample, the stage that supports and moves the sample is obviously located below the sample. In order to secure the sample onto the stage, at least part of the bottom surface of the sample must remain in snug contact with the top surface of the stage. In this setup, it is impossible to detect any mark position from that part of the sample bottom surface which is in contact with the stage top surface; the mark positions must be detected from the sample bottom surface except for the contact part thereof. Thus there are two major constraints on mark detection from the sample bottom surface. One constraint is that it is necessary to locate a mark position detector within the limited space opposite to the sample bottom surface that is not in contact with the stage top surface. The other constraint is that it is impossible to detect the positions of the sample bottom marks in the area contacting the stage. For example, where the sample is vacuum chucked onto the stage, the marks on the sample bottom surface being chucked cannot be detected. Although there has been proposed a method that uses an optical mark position detector in conjunction with a stage transparent to the mark detecting light, this method also has a disadvantage. That is, optical detection means cannot detect those sample bottom marks which correspond to the vacuum chucking grooves on the stage.

The need to keep as flat as possible the sample top surface on which to print patterns makes it desirable to distribute vacuum chucking positions as evenly and as widely as possible on the sample bottom surface. Thus the stage top is provided with regularly spaced windows (on the surface riot contacting the sample bottom surface) or transparent portions (i.e., transparent to the light for optical mark detection). Only those marks which correspond to the windows or to the transparent portions are optically detected. Where position detection marks are to be conventionally detected from the sample top surface, these marks are formed at the same time as the patterns of a semiconductor circuit or the like. This means that detecting the positions off major marks is equivalent to detecting the positions of major patterns. Where the position of a sample bottom major is to be conventionally detected, it is customary to begin the detecting process by finding the position of the sample top pattern corresponding to the bottom mark position. At this point, the mark position is readily detected if one condition is met, i.e., if the spacing of the windows or transparent portions on the stage coincides with, or is an integer multiple of, the chip size or pattern pitch of a semiconductor integrated circuit or the like to be formed on the sample top surface. If this condition is not met, mark position detection is not available. This difficulty is conventionally overcome only through the tedious replacement of the current stage with another that has vacuum chucking windows (or grooves) appropriately spaced to match the chip size for optical position detection.

In sum, little consideration has been apparently given to the above-described drawbacks in the previously proposed methods involving putting position detection marks on the sample bottom surface and detecting those marks to determine the position of the sample top surface. That is, those methods have done little to eliminate the need for switching sample stages when detecting the precise position of the sample top surface for alignment with new patterns to be formed on that surface in conjunction with the sample's chip size or pattern pitch for the semiconductor integrated circuit or the like in question.

SUMMARY OF THE INVENTION

It is therefore an object of the present invention to provide a novel position detection method which detects the positions of position detection marks on the bottom surface of a sample in order to detect the position of the sample top surface with high overlay accuracy, the method substantially eliminating the error attributable to a sample tilt in detecting the sample top surface position, the elimination of the tilt-caused error being performed without the use of a sample tills detector.

It is another object of the present invention to provide a simple, small-size mark position detector on which to practice the above-stated position detection method according to the invention.

It is a further object of the present invention to provide a novel method of printing patterns for manufacturing semiconductor devices of high density through the use of the above-stated position detection method according to the invention.

It is an even further object of the present invention to provide a novel pattern printing apparatus on which to practice the above-noted pattern printing method according to the invention.

It is another object of the present invention to provide a novel pattern printing method and a novel pattern printing apparats on which to practice the pattern printing method, the method detecting position detection marks on the bottom surface of a sample for effective alignment in response to any of different chip sizes of the semiconductor device to be manufactured, the detecting of the marks being carried out without the need to replace the sample stage that vacuum chucks the sample.

In achieving the foregoing and other objects of the present invention and according to one aspect thereof, there is provided a position detection method using a position detector to detect the positions of position detection marks on the sample bottom surface in order to determine the position of the sample top surface. The position detector is a detector whose measurements accommodate any difference that may vary depending on the tilt angle of the sample. Furthermore, the parameters of the position detector are selected and established in such a manner that the above difference will become exactly the same as the difference between the top and bottom surfaces of the sample, the latter difference being represented by the product of the tilt angle and the thickness of the sample. In this manner, regardless of the tilt angle of the sample, the mark position measurements containing the difference always represent the accurate position of the sample top surface. Thus, even the sample is tilted, detecting the position detection marks on the sample bottom surface makes it possible to obtain the exact position of the sample top surface. Whether or not the sample is tilted, any possible misalignment resulting therefrom may be regarded as nonexistent and the position of the sample top surface is accurately known. This provides precise alignment of new patterns to be printed on the sample top surface.

According to another aspect of the present invention, there is provided a pattern printing method which, while allowing the position detection method and the position detector mentioned above to acquire accurately the position of the sample top surface, moves the sample slightly for exact alignment with its pattern forming positions, and then prints the patterns on the sample top surface through exposure or writing.

According to a further aspect of the present invention, there is provided a pattern printing method which detects the positions off the mark portions provided on the sample bottom surface at a predetermined pitch and, based on the result off that detection, calculates the positions of the patterns to be printed on the sample top surface, and prints the patterns at the calculated positions through exposure or writing.

The above position detection method according to the invention works in principle as follows:

In FIG. 1, a sample 1 is shown tilting by an angle $\theta$ relative to a reference plane So. In this setup, a difference $d \cdot \sin \theta$ (d=thickness of the sample 1) occurs between the actual position Pd of a mark 2 (having a distance $\delta$ from the reference plane Po) on the sample bottom surface Sb on the one hand, and the true position Pr of the sample top surface St (having a distance $\omega$ from the reference plane Po) which corresponds to the mark 2 on the other. Thus when the actual position Pd of the mark 2 (with the distance $\delta$) is detected and the resulting measurements are used unchanged as the true position Pr (with the distance $\omega$) on the sample top surface, there inevitably develops a detection error $\epsilon$, which is given as $$\epsilon = (\delta - \omega) = d \cdot \sin\theta \qquad (1)$$

For example, if the sample thickness d is 600 $\mu$m and the sample tilt angle $\theta$ is 5 seconds, the detection error $\epsilon$ is about 0.015 $\mu$m. This valise can no longer be ignored when the overlay accuracy requirement is as high as 0.03 $\mu$m in error.

The present invention uses a position detection optical system 19 whose measurements accommodate a difference $\Delta E$ that cancels the detection error $\epsilon$. The position detection optical system 19 detects the apparent position of the mark 2 ($\delta + \Delta E$) on the sample bottom surface Sb. The optics 19 then process the apparent position so that it will represent the true position ($\omega$) on the sample top surface. In other words, the parameters off the position detection optics 19 are selected and established beforehand in such a manner that the equation $$\omega = \delta + \Delta E \qquad (2)$$

is met, i.e., the apparent mark position ($\delta + \Delta E$) detected by the optics 19 will become equal to the true position ($\omega$) of the mark 2 on the sample top surface St. The second term $\Delta E$ on the right of equation (2) is the difference contained in the measurements obtained by the position detection optics 19. That difference varies with the change in the sample tilt angle $\theta$ (i.e., through the relationship of $\Delta E = -\epsilon = -d \cdot \sin \theta$). This makes it possible, regardless of the sample tilt angle $\theta$, to cancel the detection error $\epsilon$ caused by the tilted sample. As a result, detecting the position Pd of the mark 2 on the sample bottom surface Sb precisely determines the true position Pr on the sample top surface which corresponds to the mark position Pd.

FIG. 2 shows a typical position detection optical system according to the invention, the optics providing measurements containing the difference $\Delta E$ that cancels the detection error $\epsilon$ caused by tilt of the sample. How the position detection optical system works will now be described with reference to FIG. 3.

In FIGS. 2 and 3, two light beams 11a and 11b with a wavelength of $\lambda$ each are irradiated onto the mark 2 on the sample bottom surface Sb. The phase of the resulting diffracted light beams varies depending on two factors: the position $\delta$ of the mark 2; and the distance t between the irradiated spots A and B) of the two light beams, measured perpendicular to the reference plane So. Let the distance between the two incident light beams be L and the sample thickness be d. Then as shown in FIG. 3, between the distance t across the irradiated spots on the one hand, and the tilt angle $\theta$ on the other, exists the relationship given by the relational expression $$\theta = \tan^{-1}(t/L) = t/L \qquad (3)$$

The phase difference $\phi$ ($\epsilon$), dependent on the detection error $\epsilon$ between the position $\delta$ of the mark 2 and the true position $\omega$ on the sample top surface St, is given by the equation $$\phi(\epsilon) = 4\pi\epsilon/P \qquad (4)$$

where, P is the pitch of the mark 2. On the other hand, the phase difference $\phi$ ($\Delta E$) is attributable to the distance t between the irradiated spots, the distance t being a function off the sample tilt angle $\theta$. Thus the phase difference $\phi$ ($\Delta E$) is given, with respect to the wavelength $\lambda$ of the detecting light beams and the distance t, by the equation $$\phi(\Delta S) = 4\pi t/\lambda \qquad (5)$$

That is, the pitch P of the mark 2 and the distance L between the two incident detecting light beams L are selected beforehand in such a manner that the phase difference $\phi$ (E) given by equation (4) will become exactly the same as the phase difference $\phi$ ($\Delta E$). This cancels the phase differences resulting from any sample tilt angles. When equations (1) through (5) above are solved simultaneously for the beam-to-beam distance L satisfying the above condition, we get $$L = \pi \cdot d/P \qquad (6)$$

For example, if the pitch P of the mark 2 is 6 $\mu$m, the sample thickness d is 600 $\mu$m and the detecting light wavelength $\lambda$ is 633 nm, then the required beam-to-beam distance L is 63.3 $\mu$m.

As another example, a non-conjugate type position detection optics according to the invention (shown in FIG. 13) may also be used to generate the difference $\Delta E$ that is dependent on the sample tilt angle. Then the difference $\Delta E$ may be used to cancel the detection error $\epsilon$ caused by the tilted sample.

As illustrated in FIG. 13, in a position detection optical system comprising lenses 50a and 50b, a light detector 51 is located a distance k above a conjugate position C relative to the mark 2. In this setup, when the sample 1 tilts, the difference $\Delta E$ occurs in measurements taken by the light detector 51. It is evident that the difference $\Delta E$ is also a function of the tilt angle $\theta$ of the sample 1. When the distance k is set beforehand so that the difference $\Delta E$ becomes equal to the detection error $\epsilon$ on the sample top surface, the detection error $\epsilon$ caused by the tilted sample is canceled.

As a Further example, the invention may utilize the optical path difference of reflected light beams which is attributable to the tilt of the sample 1, as depicted in FIG. 17. This setup makes use of the fact that the optical path difference between the reflected light beams 12 and 13 from the sample 1 varies depending on the tilt angle $\theta$ of the sample 1. FIG. 18 shows how the optical path difference develops between the reflected light beams when the sample 1 tilts.

Described above are three typical methods for determining the position of the sample top surface through detection of the mark position on the sample bottom surface, along with the physical arrangements on which to practice these methods. Those methods and apparatuses according to the invention eliminate detection errors from the measurements of the position of the sample top surface if the sample tilts. However, these methods and apparatuses are not limitative of the invention. The invention may be implemented using any other position detection method and its accompanying setup as long as they comprise the steps of generating a difference in the results of sample surface position detection, the difference being dependent on the tilt angle of the sample, and of allowing the difference to cancel a detection error between the top and bottom surfaces of the sample, the error being attributable to the sample tilt.

Below is a description oil how position detection marks are arranged on the sample bottom surface according to the invention. Where position deflection marks are located at regular intervals on the sample bottom surface, the detection process involves detecting the positions of at least two marks to acquire the parallel movement error of the wafer position, and the rotation error and homogeneous deformation within the sample surface. Detecting the positions of more marks makes it possible to obtain a localized in-plane deformation of the sample. Where the results of the above position detection are used to calculate the positions of new circuit patterns to be formed anew, the calculating process primarily involves interpolation. The interpolation-based process does not require the positions of patterns on the sample top surface to correspond one for one to the mark positions on the sample bottom surface. Since the stage on which to place the sample has been measured precisely using a laser interferometer, the sample can be accurately aligned for new pattern forming.

The above and other related objects and features of the invention, as well as the novelty thereof, will clearly appear from the following description and from the accompanying drawings.

DESCRIPTION OF PREFERRED EMBODIMENTS

Preferred embodiments of the present invention will now be described with reference to the accompanying drawings.

First Embodiment

Figure 2:
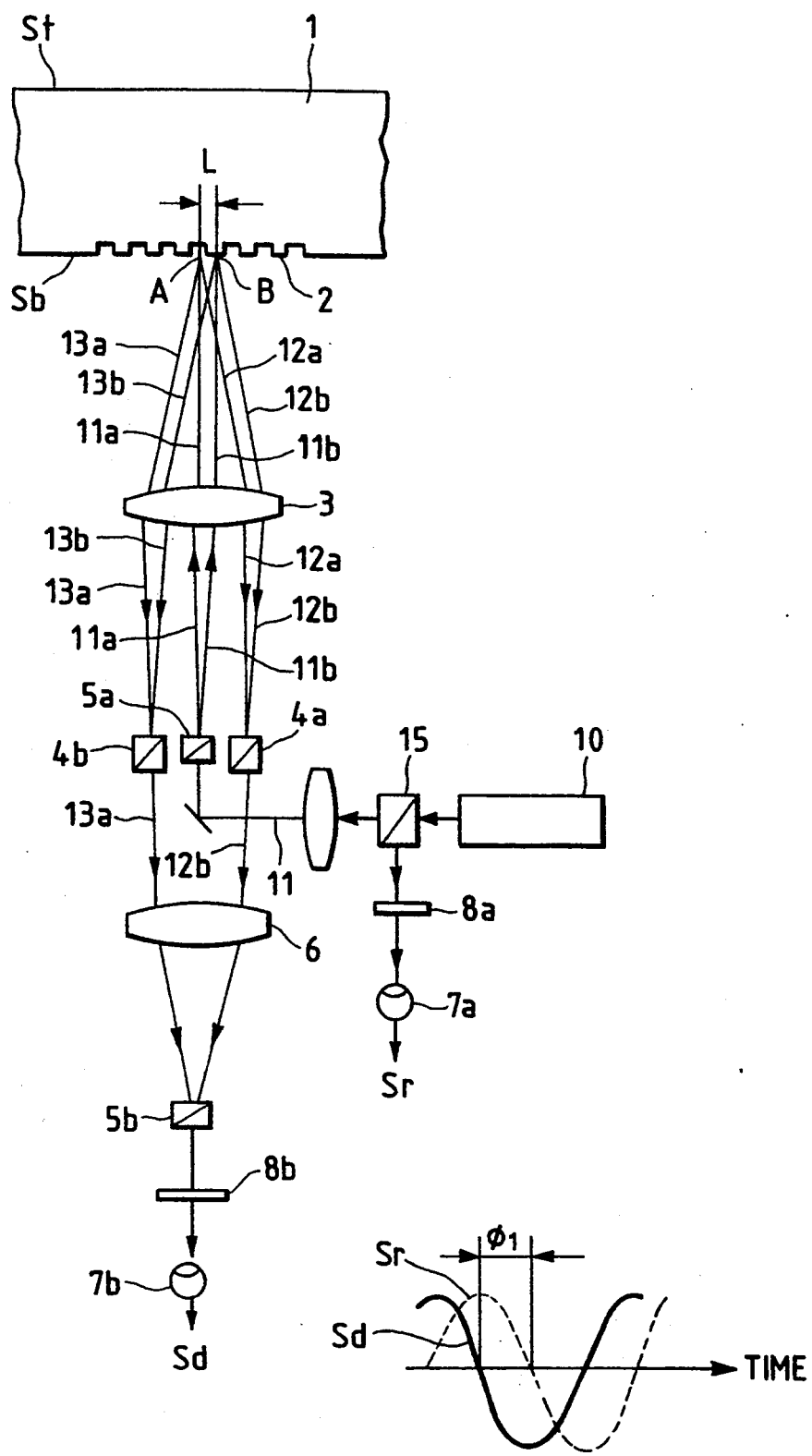
FIG. 2 is a schematic diagram of a mark position detector according to the invention.

FIG. 2 depicts the basic structure of a position detection optical system constructed according to the invention. This position detection optics is used in combination with the known method of detecting marks on the sample bottom surface so as to find the corresponding positions on the sample top surface. In operation, the position detection optics cancel the detection error that occurs if the sample tilts and thereby generates a positional difference between the top and bottom surfaces of the sample.

Figure 4:
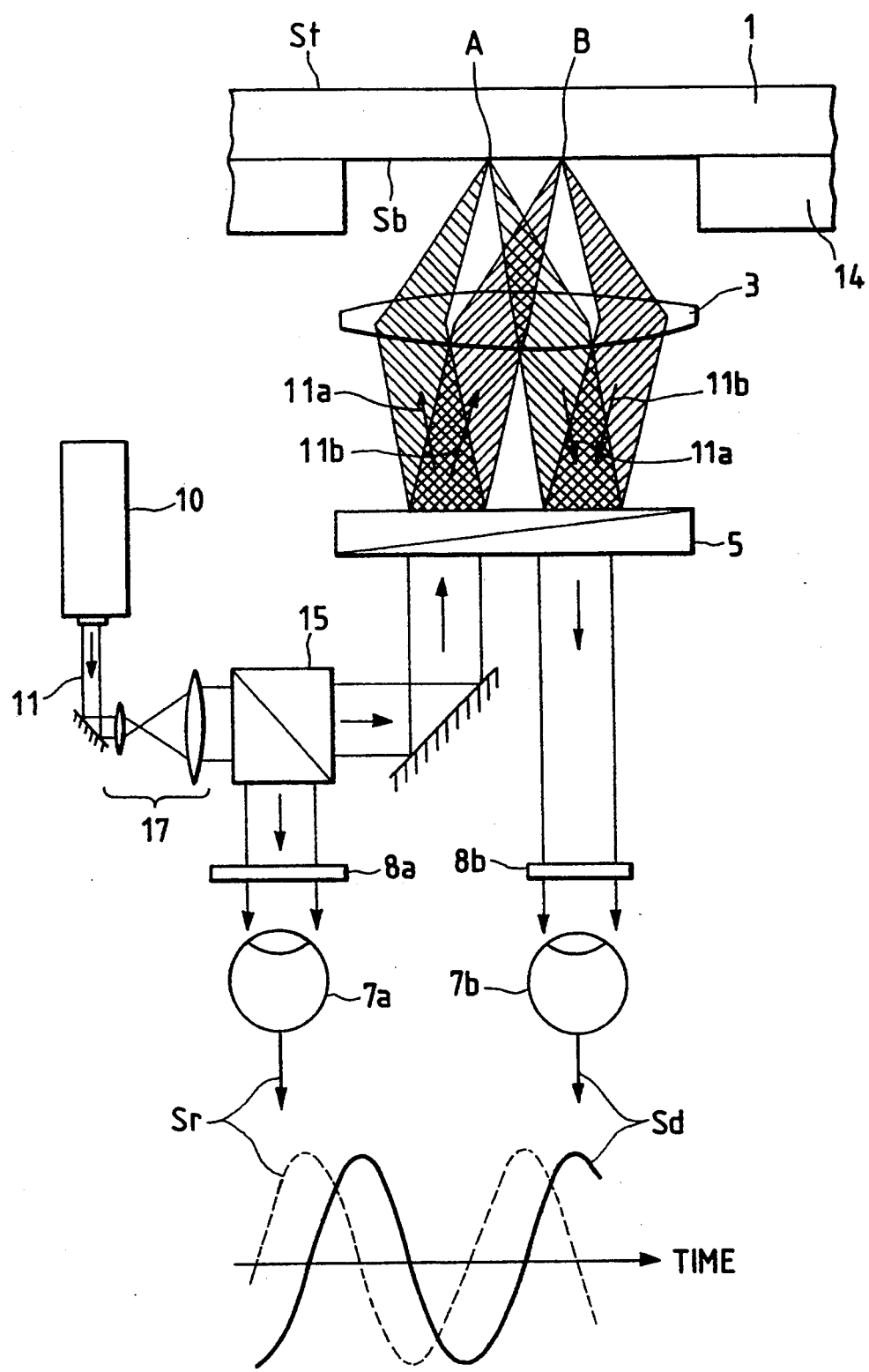
FIG. 4 is a schematic diagram of a prior art surface roughness measurement instrument that utilizes the conventional Nomarski interferometer.

Mark positions are detected as follows: FIG. 4 is a schematic diagram of the typical prior art surface roughness measurement instrument illustratively described in "APPLIED OPTICS" (Vol. 20, No. 4, p. 610). This instrument works basically on the operating principle of the Nomarski interferometer.

The setup of FIG. 4 employs a laser light source 10 that emits two linearly polarized light beams with slightly different wavelengths. The light beams 11 from the laser light source 10 are expanded by a lens system 17 and are each split in to by a beam splitter 15. One set of the split light beams enters an analyzer 8a in which heterodyne interference is generated. The resulting interference light beams are detected by a light detector 7a that provides a reference signal St. The other set of the split light beams enters a Wollaston prism 5. The prism 5 separates the incident split light beams into a P polarized light beam 11a (frequency $v_1$) and an S polarized light beam 11a (frequency $v_2$). The separated beams 11a and 11b are focused by an objective lens 3 or irradiation onto two points A and B on the sample bottom surface. After being reflected at the points A and B, the beams pass through the objective lens 3 and enter the Wollaston prism 5. Here, the two reflected light beams from the points A and B converge, forming a single beam that enters an analyzer 8b. The analyzer 8b, tilted at 45 degrees to the polarized plane of the light beam 11, generates heterodyne interference. The resulting interference light beam is detected by a light detector 7b that provides a detection signal Sd. The period of the detection signal Sd is the same as that of the reference signal Sr. Thus if the sample 1 tills, the optical path difference between the detected light beams 11a and 11b varies with the tilt angle of the sample 1; the phase difference of the detection signal Sd with respect to the reference signal Sr is changed accordingly.

FIG. 2 depicts a specific setup that operates on the principle of detection illustrated in FIG. 4, the setup detecting the positions of marks 2 on the sample bottom surface. As with the detection method of FIG. 4, the setup of FIG. 2 utilizes a two-frequency laser light source 10 that emits two linearly polarized light beams with two slightly different wavelengths. The light beam 11 from the laser light source 10 is separated by a Wollaston prism 5a into a P polarized beam 11a and an S polarized beam 11b. The two light beams pass through the objective lens 3 and are irradiated onto a grating mark 2 on the sample bottom surface. The distance between the two irradiated spots A and B is represented by L.

Figure 3:
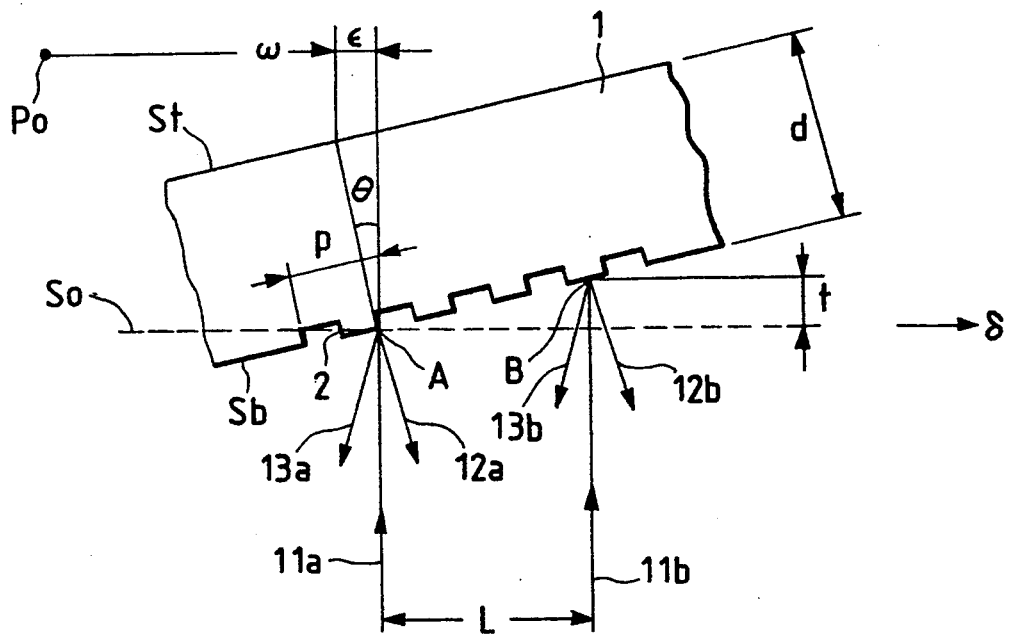
FIG. 3 is a schematic view depicting how the mark position detector according to the invention works.

Of the diffracted light beams from the spots A and B, positive first order diffracted light beams 12a, 12b and negative first order diffracted light beams 13a, 13b are considered here. As mentioned above, the phases of these first order diffracted light beams varies with the position of the mark 2 and with the tilt angle of the sample 1. The phase deviation $\phi_1$ is obtained as the phase difference between the reference signal Sr from the light detector 7a on the one hand, and the detection signal Sd from the light detector 7b on the other. The positive first order diffracted light beams 12a, 12b and the negative first order diffracted light, beams 13a, 13b are made into parallel beams by the objective lens 3. Polarized beam splitters 4a, 4b used on a Fourier transform plane illustratively select one of the positive first order diffracted light beams (e.g., beam 12b from the irradiated spot B) and one or the negative first order diffracted light beams (e.g. beam 13a from the irradiated spot A). The selected beams 12b and 13a are placed by a condenser lens 6. Another Wollaston prism 5b is prism placed at the cross point of the two focused beams, whereby heterodyne interference is generated. The resulting interference light is detected by the light detector 7b via the analyzer 8b that provides the reference signal Sd. The phase difference $\phi_1$ between the detection signal Sd thus obtained and the reference signal Sr is given as $$\phi_1 = (4\pi\delta/P) + (4\pi t/\lambda) \tag{7}$$

where $\delta$ is the position of the mark 2, P is the pitch of the mark 2, $\lambda$ is the wavelength of the detecting light, and t is the difference between the irradiated spots A and B perpendicular to the reference plane, as shown in FIG. 3. Suppose that the difference t is in the negative direction and that d stands For the sample thickness, $\theta$ for the till angle of the sample, and L for the distance between the irradiated beams 11a and 11b. In this case, the difference (i.e., detection error) $\epsilon$ a caused by the sample tilt angle between the top and bottom surfaces of the sample is given as $$\epsilon = d \cdot \sin\theta \tag{8}$$

where $$\theta = \tan^{-1}(t/L) = t/L \tag{9}$$

The mark pitch P and the beam-to-beam distance L are then determined so that the phase deviation caused by the difference $\epsilon$ will become equal to the phase deviation attributable to the difference t. In other words, the equation $$(4\pi t/\lambda) = (4\pi\epsilon/P) \tag{10}$$

is to be satisfied. That is, from equations (7) through (10), it is clear that the equation $$d/P = L/\lambda \tag{11}$$

need only be satisfied.

From equation (11), it can be seen that if the light source 10 is a He—Ne laser arrangement with a wavelength $\lambda$ of 633 nm, the beam-to-beam distance L is to be 68.3 $\mu$m provided the thickness d of the sample 1 is 600 $\mu$m and the mark pitch P is 6 $\mu$m. The beam-to-beam distance L is determined by the bean, split angle $\zeta$ of the Wollaston prism 5a and by the focal distance f of the objective lens 3. That is; where the required beam-to-beam distance L is known, the bean, split angle is determined by the equation $$\zeta = 1/(2f) \tag{12}$$

Thus what is needed is to use a Wollaston prism having the above beam split angle $\zeta$.

Figure 5:
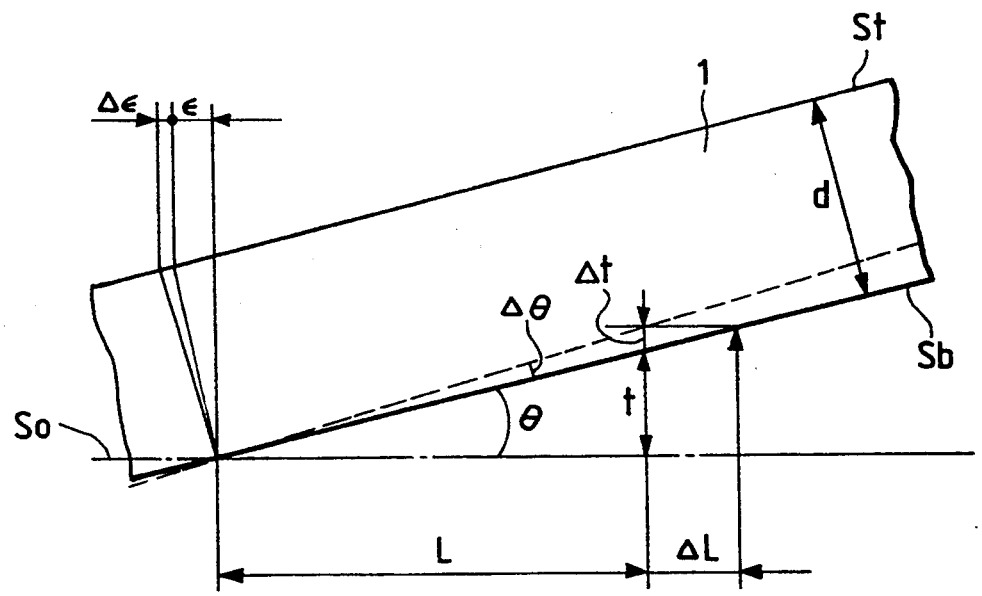
FIG. 5 is a schematic view describing the tolerable distance between light beams in connection with the mark position detector according the invention.

Next to be considered is the tolerance $\Delta L$ of the error in establishing the required beam-to-beam distance L. As illustrated in FIG. 5, where the tolerance $\Delta L$ is a finite value, a detection error $\Delta\epsilon$ occurs due to the sample tilt. Here, the detection error must be limited to $$\Delta\epsilon < 0.01 \mu m$$

with respect to the target overlay accuracy value of 0.03 $\mu$m (3$\sigma$). The tilt angle $\theta$ attributable to the warp of the sample 1 is generally about $\pm 0.15$ m rad. At this time, the detection error $\Delta\epsilon$ is given by the equation $$\Delta\epsilon = (\Delta L/L)\theta \cdot d \tag{13}$$

Arranging the above equation reveals that the tolerance and $\Delta L$ of the error setting the beam-to-beam distance L needs to be limited to about 15% of the distance L. Thus the tolerance $\Delta L$ is considered small enough if limited to 10% or less of the distance L so that some margin of error may be allowed for. Consequently, the beam-to-beam distance L should preferably be selected within the range of $$0.9(d \cdot \lambda/P) < L < 1.1(d \cdot \lambda/P)$$

Figure 6:
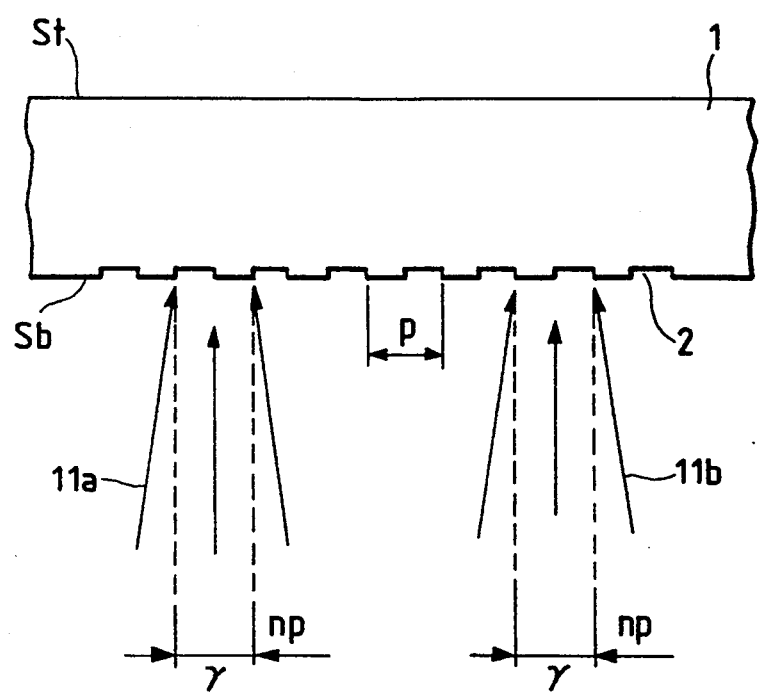
FIG. 6 is a schematic view depicting desirable light beam diameter settings for the mark position detector according to the invention.

As depicted in FIG. 6, the irradiated spot diameter $\gamma$ of the beams 11a, 11b directed to the sample should preferably be determined as $$\gamma = n \cdot P \tag{14}$$

where, n is a natural number, This minimizes any disturbing effects from steps of the mark 2.

When the sample thickness is changed, the pitch P of the mark 2 is determined using the equation $$p = d \cdot \lambda/L \tag{15}$$

which is obtained by modifying equation (11).

The tolerance $\Delta P$ of the error in establishing the mark pitch P is also considered. If the mark pitch P contains an error $\Delta P$, the detection error $\Delta\delta$ resulting therefrom is given, using equation (10), as $$\Delta\epsilon = (t/\lambda)\Delta P \tag{6}$$

If the same condition as that for calculating the tolerance $\Delta L$ in selling the beam-to-beam distance L is applied here, the tolerance $\Delta P$ in setting the mark pitch P is $\pm 0.7$ $\mu$m. The tolerance $\Delta P$ here is about 12% of the required mark pitch P. The value $\Delta P$ is considered small enough if limited to 10% of less of the pitch P so that some margin of error may be allowed for. Thus the mark pitch P should preferably be selected within the range of $$0.9(d\lambda/L) < P < 1.1(d\lambda/L)$$

In this manner, it is possible to detect the positions of marks on the sample bottom surface so as to find with precision the desired pattern forming position on the sample top surface without the use of a separately installed tilt detector for detection of the tilt angle of the sample.

Figure 7:
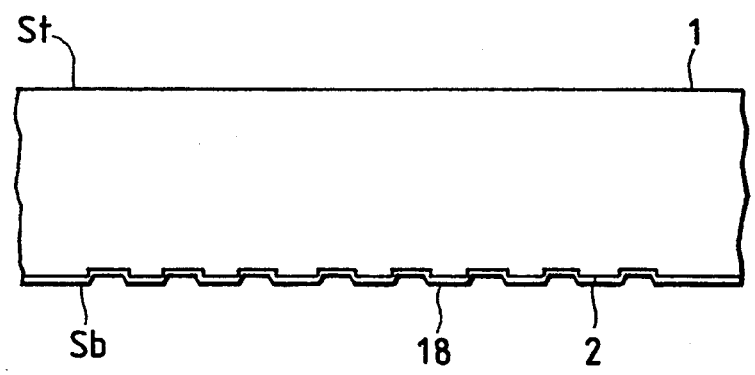
FIG. 7 is a view of one example of position detection marks provided on the sample bottom surface in connection with the mark position detection method according to the invention.

The marks 2 described above are readily formed by illustratively utilizing a laser marker. The formed marks 2 should preferably be protected with a protective film 18 such as an oxide film, as depicted in FIG. 7.

Figure 8:
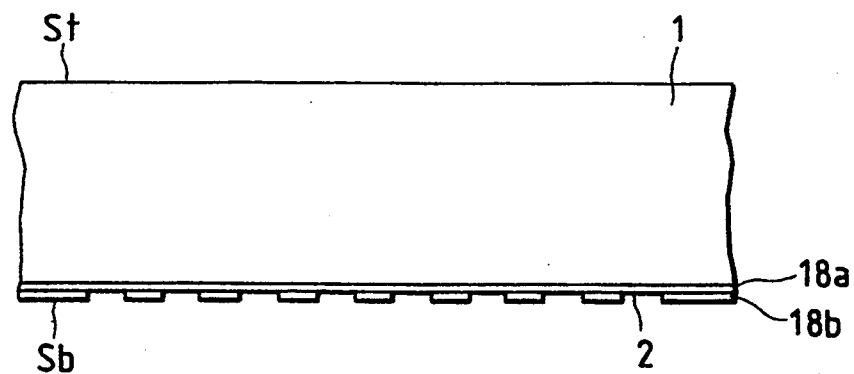
FIG. 8 is a view of another example of position detection marks provided on the sample bottom surface in connection with the mark position detection method according to the invention.

As shown in FIG. 8, a protective film 18a may be overlaid with another protective film 18b onto which marks 2 may be formed. This arrangement eliminates the need for directly processing the sample 1 (e.g., Si substrate) for mark formation. That in turn prevents defects from being generated within the Si substrate by dislocation and like adverse factors.

Another alternative is to use the so-called micro-fabrication technology implemented on a scanning tunneling microscope such as one described in Denshi Zairyo ("Electronic Materials" in Japanese; the January 1991 issue, pp. 55-60). This technology is used to form marks whose sizes are on the order of atoms. These marks, when used for position detection, improve the sensitivity of position detection and reduce detection errors attributable to the deformation and strain in the sample.

The sample 1 is not limited to the Si substrate. The sample may be composed of a GaAs substrate, a glass substrate or a plastic resin substrate. Any of these substrates may be coated with a sensitive thin film to constitute a dummy wafer.

Figure 9:
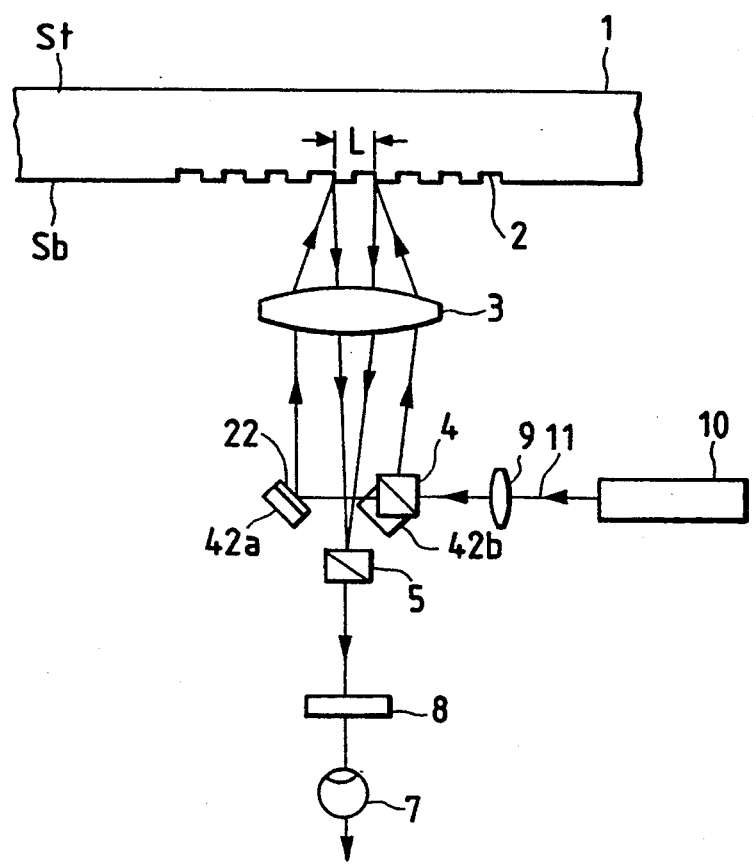
FIG. 9 is a schematic diagram of another mark position detector according to the invention.

FIG. 9 is a variation of the above-described embodiment. The mark position detector setup of FIG. 9 is constructed by switching the positions of the incident and reflected light beams to and from the sample in the setup of FIG. 2.

In FIG. 9, laser light beam from the two-frequency laser light source 10 is collimated by a lens 9. After that, the laser light beam is split into two beams by a polarized beam splitter 4. One beam, which is reflected, is incident on the sample through the objective lens 3. The other beam, which is transmitted, is reflected by a reflecting mirror 22 before becoming incident on the sample through the objective lens 3. At this time, the reflection angles of the beam splitter 4 and of the reflecting mirror 22 are set so that the irradiated spots of the two beams on the sample bottom surface will become the distance L apart.

Of the light beams diffracted by the mark 2, only those two that are perpendicular to the sample bottom surface (i,e., positive and negative first order diffracted light beams) are extracted and condensed by the objective lens 3. The two beams are combined by the Wollaston prism 5 with its beam split angle identical to the cross angle of the two condensed beams. The combined light beam enters the polarize 8 where heterodyne interference is generated. The interference light is detected by the light detector 7. The mark position detector of the above construction is thus made smaller than ever in size.

Where it is desired to change the thickness d of the sample 1, the reflection angles of the reflecting mirror 2 and of the polarized beam splitter 4 need only be adjusted accordingly so that the beam-to-beam distance L will satisfy equation (11). The adjusting of the reflection angles is performed using reflection angle adjusting means 42a and 42b.

Second Embodiment

Figure 13:
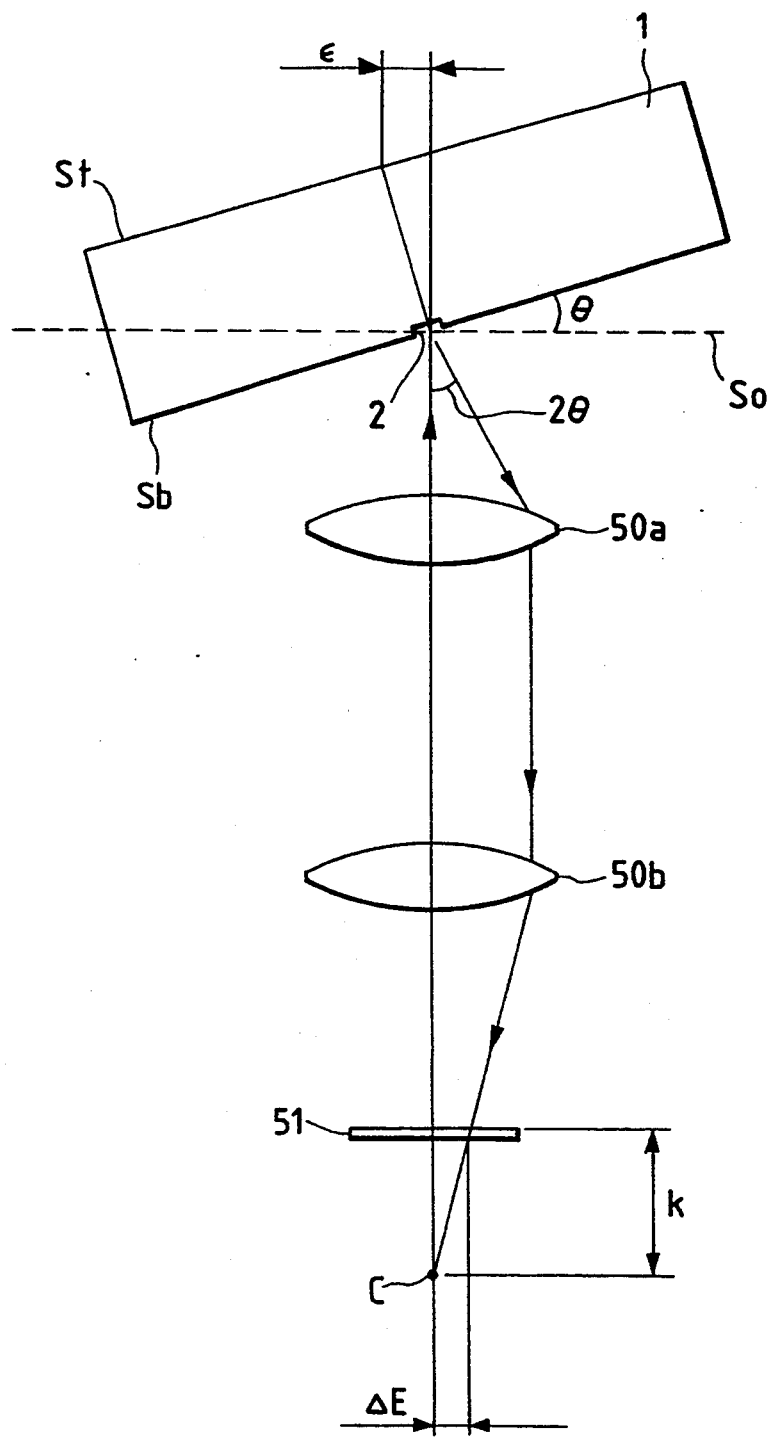
FIG. 13 is a schematic view illustrating the theoretical structure of another position detector according to the invention.

FIG. 13 illustrates the structure of another position detector according to the invention. This position detector utilizes a non-conjugate position detection optical system to detect mark positions with high precision.

In the first embodiment described above, two light beams are irradiated at the mark on the sample bottom surface. The light beams diffracted by the sample are checked for a difference in their optical phase. The phase difference is used to detect the mark position on the sample bottom surface. In an alternative embodiment, a non-conjugate position detection optical system such as the one shown in FIG. 13 may be used to generate, in position detection measurements, a deviation that is dependent on the tilt angle of the sample. That deviation may be used to cancel the detection error $\epsilon$ caused by the tilted sample.

Figure 14:
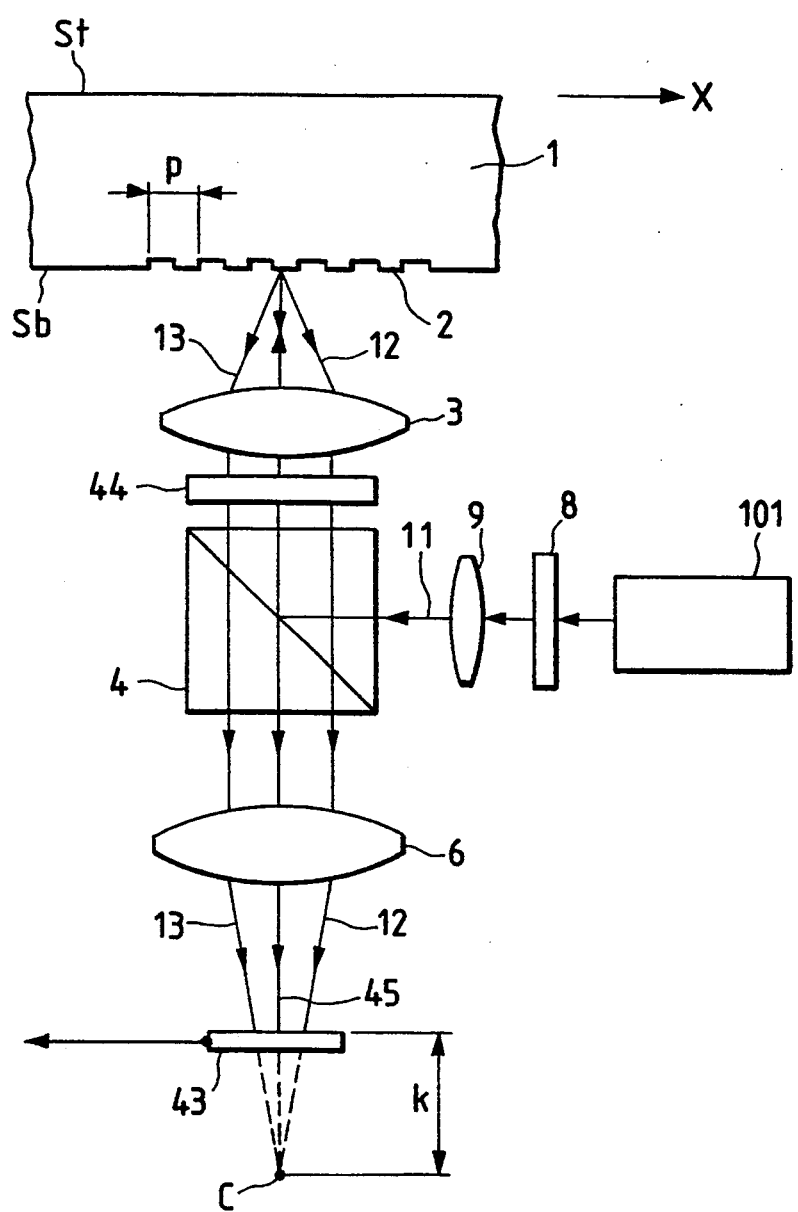
FIG. 14 is a schematic diagram of a specific position detector constructed in accordance with the theoretical structure of FIG. 13.

Below is a description of the principle of position detection by use of the non-conjugate position detection optics, with reference to FIG. 14.

A laser light beam emitted by a laser light source 101 passes through the polarizer 8 and a collimator lens 9 and is split by the polarized beam splitter 4 for entry into a $\lambda/4$ phase shifter. Thereafter, the split beams are condensed by the objective lens 3 for irradiation onto the mark 2 on the sample 1. The positive first order diffracted light 12, the negative first order diffracted light 13, and a 0-th order diffracted light 45, all returning their respective irradiated spots, again pass through the objective lens 3, $\lambda/4$ phase shifter 44 and polarized beam splitter 4 and are condensed by the condenser lens 6, The condensed beams enter a two-divided photo detector 43 located a distance k above the conjugate position 6.

Figure 15:
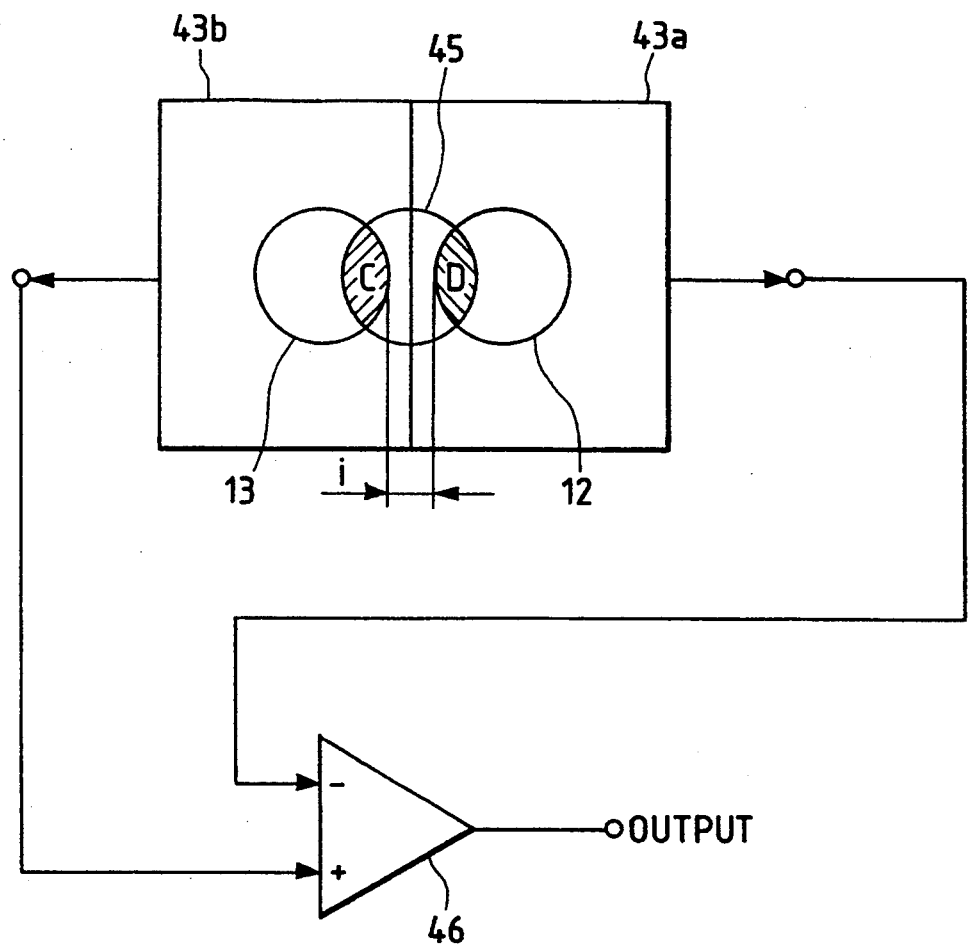
FIG. 15 is a detailed view of a photodetector used in the position detector of FIG. 14.
Figure 15:
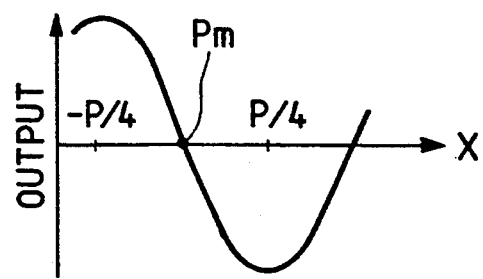

How the light beams 12, 13 and 45 are incident on the photo detection surface of the photo detector 43 will now be described with reference to FIG. 15. The 0-th order diffracted light 45 enters the center of the photo detection surface of the photo detector 43, flanked by the positive first order diffracted light 12 and the negative first order diffracted light 13. In this arrangement, a shift of the mark 2 in the horizontal direction (X direction) causes the intensity light to cleavage in areas C and D through interference. Here, subtraction means 46 is used to obtain the difference between outputs from photo detection surfaces 43a and 43b. This reveals that, as shown in the lower part of FIG. 26, the difference varies linearly with respect to the detection position (X). The observations in turn make it possible to detect the mark position. The photo detector 43 is not limited to the two-divided type; any detector of three or more divided types may be used and the effect is the same.

Figure 1:
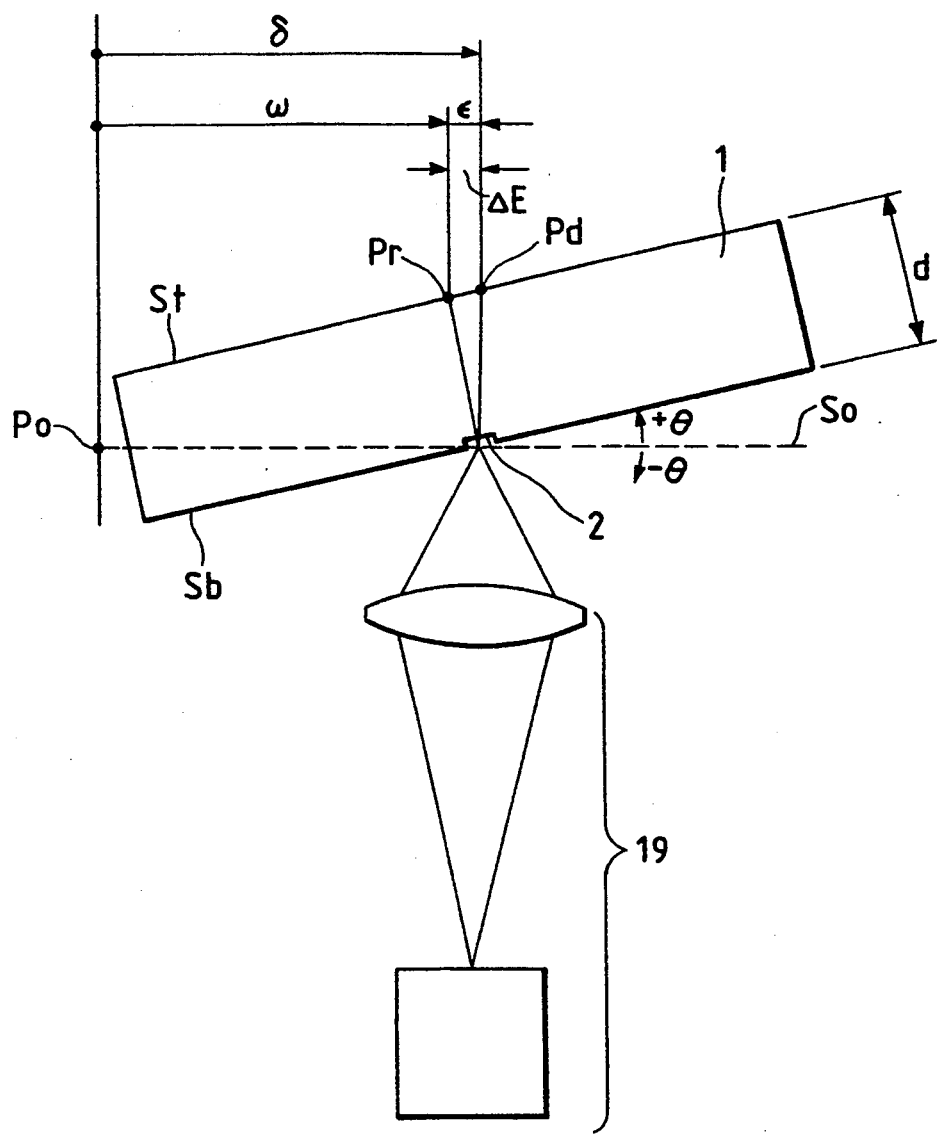
FIG. 1 is a view illustrating how a mark position detection method according to the invention works.
Figure 16:
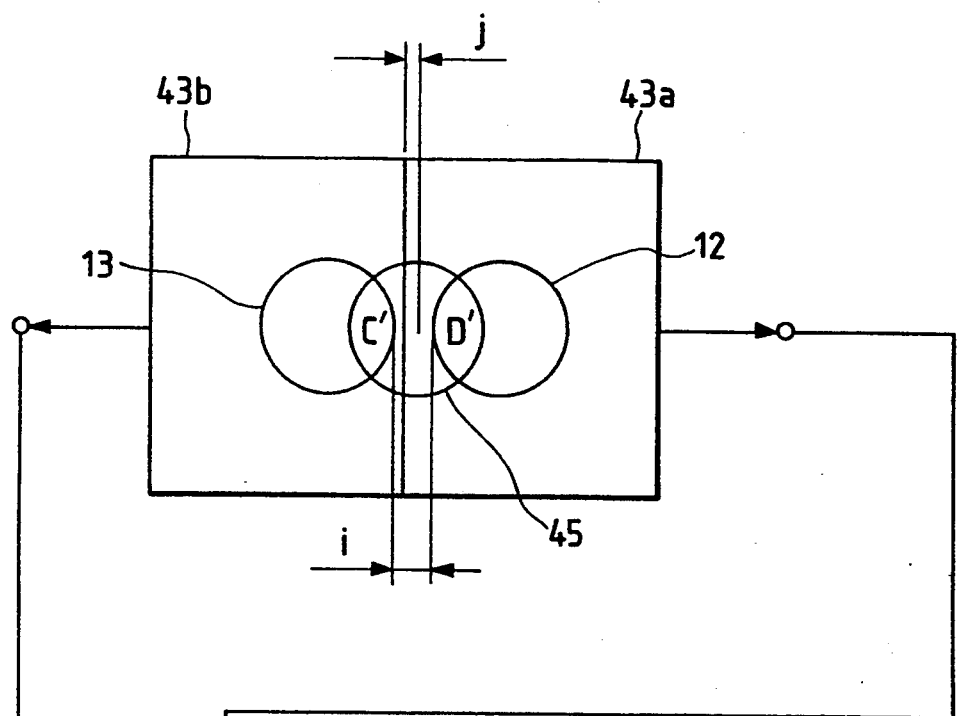
FIG. 16 is a view depicting how a light beam spot incident on the photo detector of FIG. 15 varies when the sample tilts.
Figure 16:
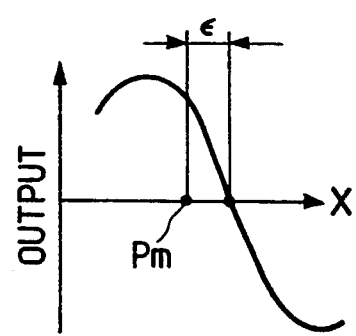

How the detection signal behaves when the sample 1 tilts will How be described with reference to FIG. 16. As mentioned above, the photo detect, or 43 in this mark position detection optical system is located a distance k away from the conjugate system of the optics. Thus the light beams 12, 13 and 45 are shifted crosswise by a distance j before entering the photo detector 43. In this case, the 0-th order diffracted light 45 is incident more on the photo detection surface 43a than on the photo detection surface 43b. An imbalance of output between the photo detection surfaces 43a and 43b leads to an offset in the output difference from the subtraction means 46. Here, providing a distance i between areas C' and D' allows the amount of the offset contained in the output difference to have a linear relation with respect to the tilt angle $\theta$ of the sample 1. If the sample 1 has a different thickness d, the distance k may be adjusted using equation (8) so that the deviation s in FIG. 1 will become equal to the above-described offset. This setup provides a highly precise position detector immune to the detection errors attributable to the tilt of the sample 1.

Third Embodiment

Figure 17:
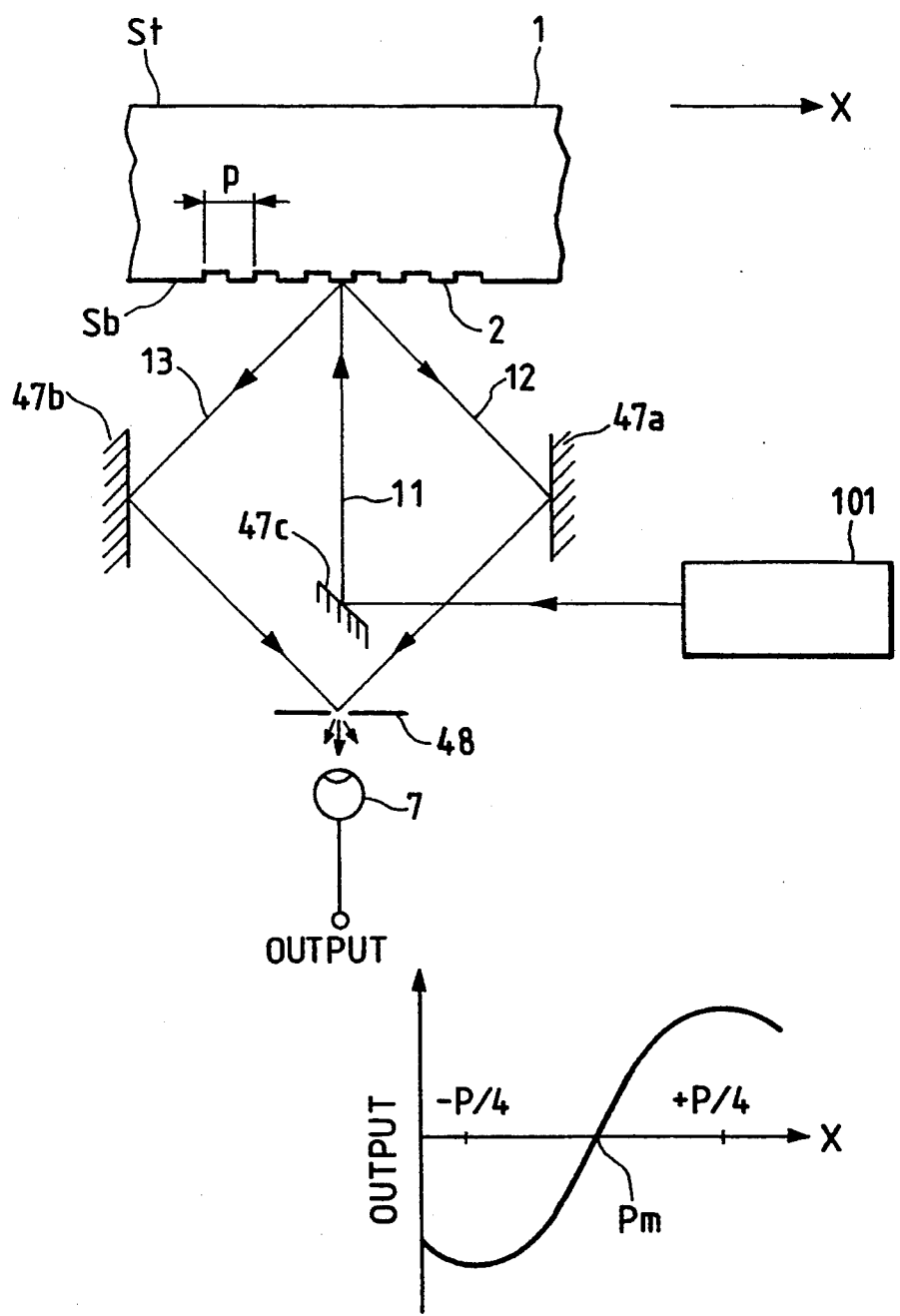
FIG. 17 is a schematic view showing the theoretical structure of yet another position detector according to the invention.

FIG. 17 shows the structure of yet another position detector according to the invention. This embodiment is designed to provide highly precise position detection through application of the interferometer principle.

In FIG. 17, a light beam emitted by the laser light source 101 is irradiated onto the mark 2 on the bottom surface of the sample 1 via a mirror 47c. The positive first order diffracted light 12 and the negative first order diffracted light 13 coming from the irradiated spot are reflected by mirrors 47a and 47b, respectively. These diffracted light beams are interfered with by a slit 48. The resulting dark-and-light interference fringe pattern is detected by the light detector 7 through the aperture of the slit 48. When the width of the slit aperture is set exactly for half of the interference fringe pitch, a detection signal of a high S/N ratio is obtained. Under this condition, shifting the mark 2 in the X direction changes the output signal of the tight detector 7, as depicted in the lower part of FIG. 17. In this manner, the output signal allows the position of the mark 2 to be detected.

Figure 18:
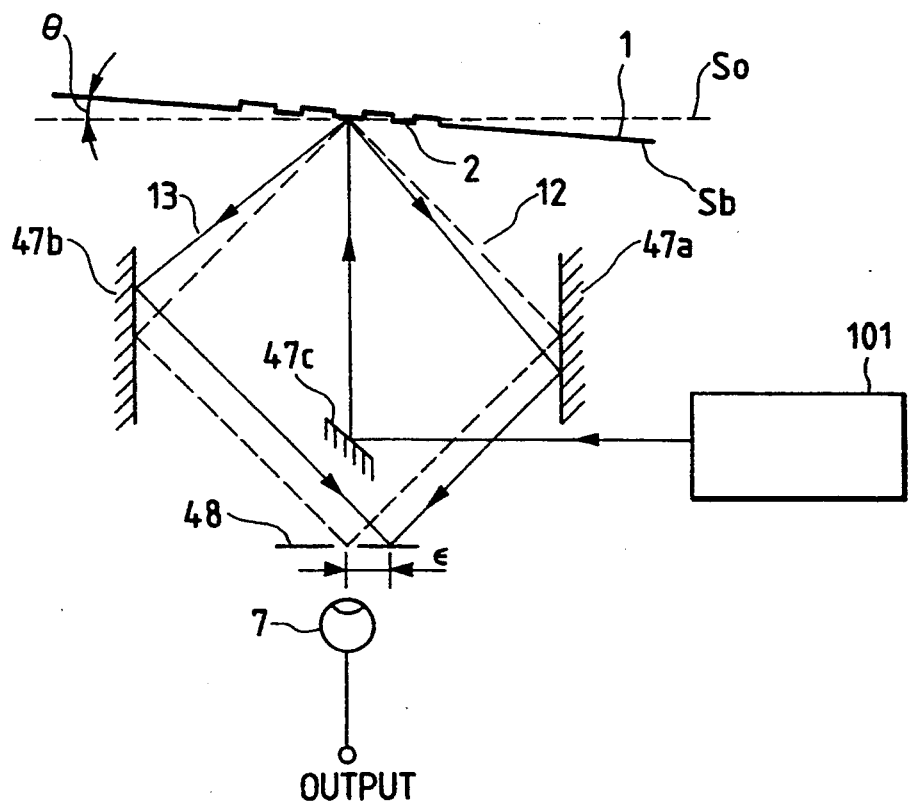
FIG. 18 is a schematic view illustrating the principle of mark position detection performed by the position detector of FIG. 17.

How diffracted optical paths change when the sample 1 tilts at an angle $\theta$ relative to the reference plane will now be described with reference to FIG. 18. When the sample 1 is tilted, the first order diffracted light beams 12 and 13 are shifted from broken to solid line paths in FIG. 18. That is, optical path differences occur for the first order diffracted light beams 12 and 13. This causes the interference fringe on the slit 48 to shift crosswise. In other words, when the sample 1 tilts, an offset is included in the result of mark position detection. Here, the distance between the mirrors 47a and 47b and the pitch P of detection marks 2 may be selected so that the offset will become equal to the error $\epsilon$ given by equation (8). In his manner, he detection error caused by the tilt of the sample 1 is canceled, and the position of the sample top surface is detected with high precision.

Fourth Embodiment

Figure 10:
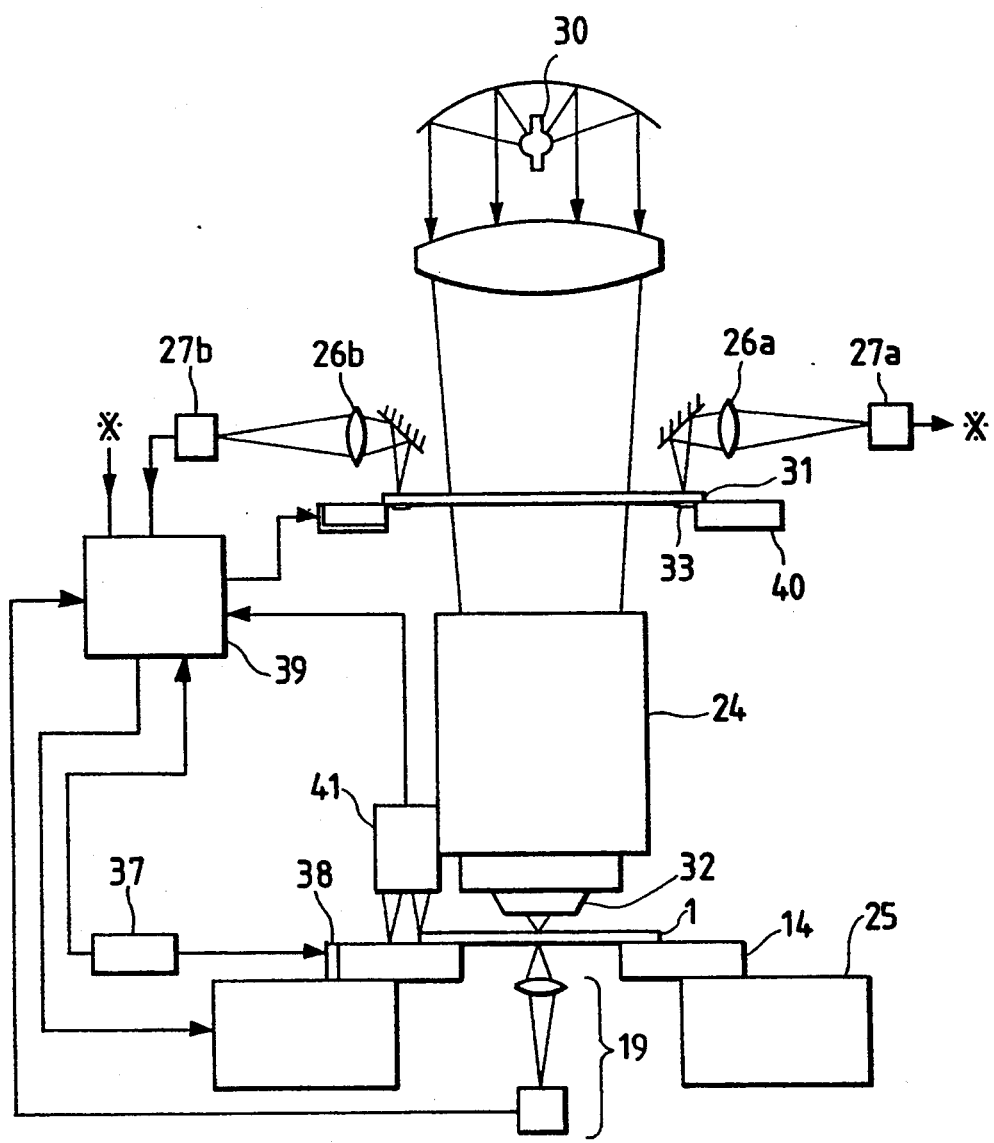
FIG. 10 is a schematic diagram of a stopper that uses the mark position detector according to the invention.

FIG. 10 illustrates the method of sample bottom mark detection according to the invention as it is applied to a stepper. A bottom surface mark detector that cancels the detection error caused by the tilt of the sample 1 is particularly suitable for position detection in the stepper; the stepper is a principal pattern forming apparatus utilized in semiconductor device production.

In FIG. 10 the patten to be printed which is formed on a reticle 31 is illuminated by a monochromatic light source 30 for reduced projection through a reduction projection lens 24 onto the top surface of the sample 1. With the reduction projection lens 24 interposed between the reticle 31 and the sample 1, it is difficult to position a mark detector on top of the sample 1. Thus in this setup, it is particularly effective to use a mark position detector 19 under the sample I so tidal sample bottom marks are detected from below.

While the exact position of the sample top surface is being detected with the mark-position detector 19, a fine positioning wafer stage 25 is used to fine-position the sample position in the X-Y directions. The fine positioning of the sample is performed so that the pattern to be printed will be projected in a reduced size onto the desired pattern-forming position on the sample top surface. At this time, the position of the mirror 38 attached to the sample table 14 is precisely measured. The measured position of the sample table 14 provides the basis that allows a fine positioning wafer stage controller 39 to control 1, the fine positioning wafer stage 25.

The position of the reticle 31 is determined by detecting a mark 33 on the reticle 31 through the use of detectors 27a and 27b via reticle mark detection optics 26a and 26b. A fine position reticle stage 40 fine-positions the reticle 31 using the result of reticle mark position detection. This allows the reticle 31 to be positioned relative to an absolute reference.

An automatic focusing tool 32 is provided to focus the reduction projection lens 24 on the pattern forming position of the sample top surface. Illustratively, the automatic focusing tool 32 may be gal.keeping means that operates on the air micrometer principle to keep the relative gap constant between the sample top surface and the reduction projection lens. A wafer thickness measurement tool 41 measures the sample thickness. Given the measured sample thickness, a decision is made as to whether or not to correct the deviation contained in the position measurements detected by the mark position detector 19.

Fifth Embodiment

Figure 11:
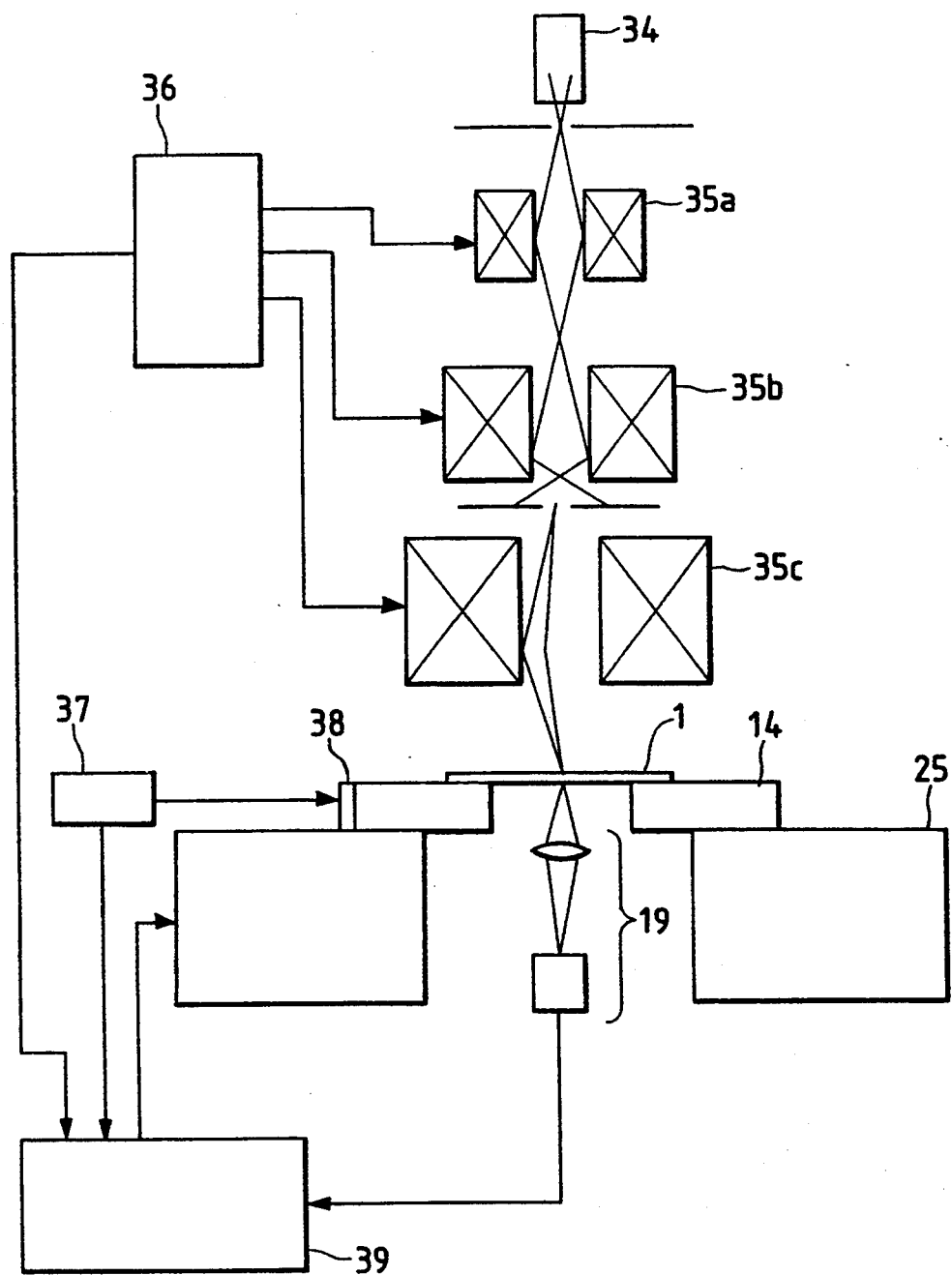
FIG. 11 is a schematic diagram of an electron beam lithography system that uses the mark position detector according to the invention.

FIG. 11 depicts the method of sample bottom mark detection according to the invention as it is applied to the positioning of an electron beam lithography system.

In the electron beam lithography system shown in FIG. 11, the pattern data stored in a pattern data memory 36 are used to control an electron gun 34 electron lenses 35a, 35b and 35c. These components form a desired pattern on the top surface of the sample 1. Under the bottom surface of the sample 1 is the mark position detector 19 according to the invention. Since the position detection method of the mark position detector 19 is the same as that described in connection with the first, second and third embodiments above, no detailed description of the method will be given herein.

As schematically illustrated in FIG. 11, the positioning of the electron beam lithography system is carried out with higher precision than ever before when the invention is applied to the system.

Sixth Embodiment

Figure 12:
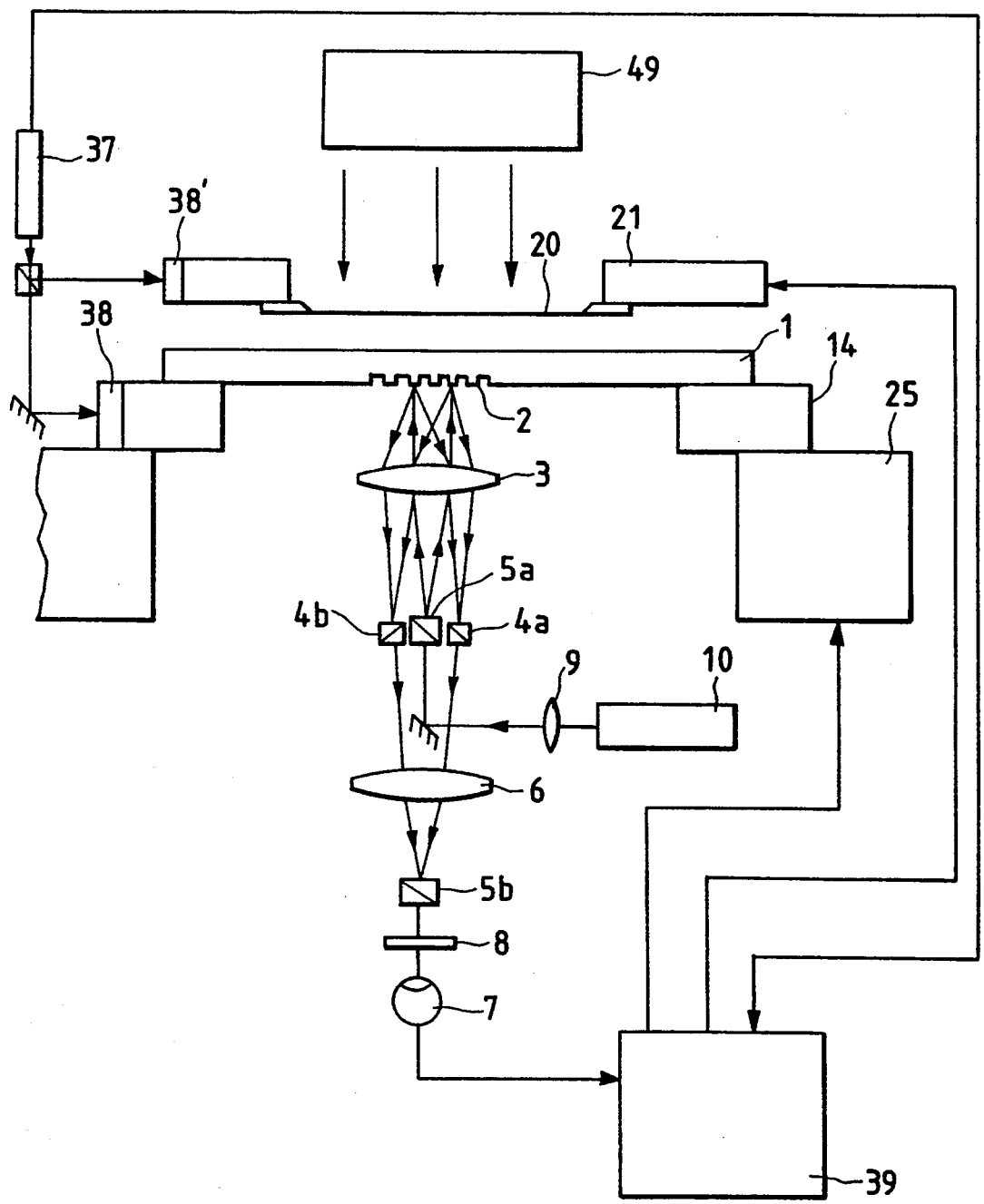
FIG. 12 is a schematic diagram of a proximity exposure system that uses the mark position detector according to the invention.

FIG. 12 schematically depicts the method of sample bottom mark detection according to t,he invention as it is applied to the positioning of a proximity exposure system with unity magnification.

As shown in FIG. 12, the bottom surface mark detection method according to the invention may also be applied effectively to the proximity exposure system with unity magnification in the same manner as with the stepper and electron beam lithography system mentioned above. With the sample 1 located close to a pattern mask 20 on which the desired pattern is written, the mask 20 is exposed to X rays from an X-ray source 49 so that the pattern will be formed on the top surface off the sample 1. The pattern mask 20 is supported on a fine positioning mask stage 21. The position of a mirror 38' is measured precisely with a laser interferometer 37. The measurements provide the basis that allows the fine positioning wafer stage controller 39 to control the fine positioning mask stage 21. This affords fine positioning of the pattern mask 20.

The mark position detection method of the sixth embodiment is the same as that of the first, second and third embodiments above, and the pattern forming method of the sixth embodiment is the same as that of the fourth and fifth embodiments. Thus no detailed description of these methods will be given here.

Seventh Embodiment

Figure 19:
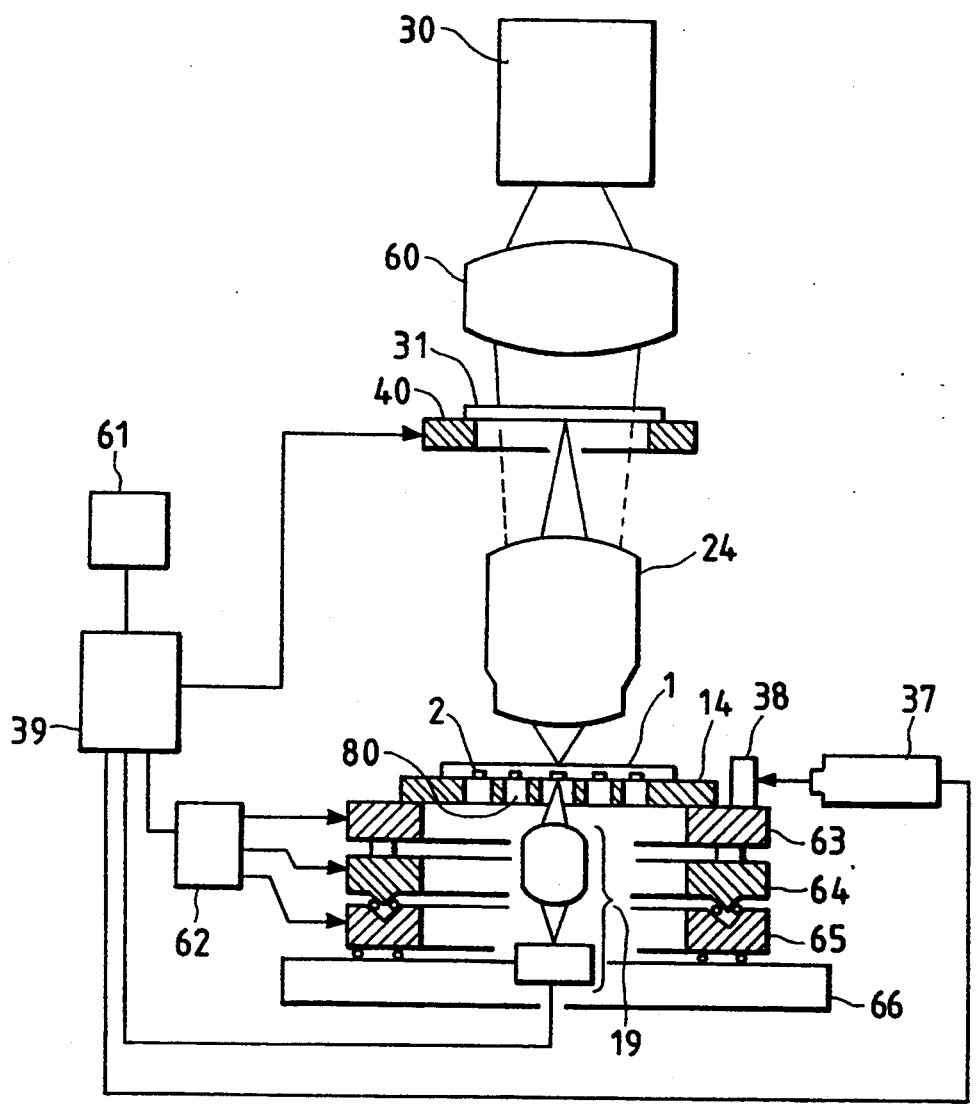
FIG. 19 is a schematic diagram off a pattern forming apparatus according to the invention.

FIG. 19 shows another embodiment of the invention. This embodiment is a stepper that operates on the position detection method according to the invention. In this stepper, the pitch of the disposition of patterns to be printed on the sample top surface differs from the pitch of position detection marks on the sample bottom surface.

In FIG. 19, a light beam from the light source 30 passes through a condenser lens 60 and illuminates the reticle 31 on which the pattern semiconductor integrated circuit, etc. is written. The light beam is diffracted by the pattern on the reticle 31 before reaching the top surface of the sample 1 through the reduction projection lens 24. As a result, the pattern of the reticle 31 is projected in a reduced size onto the top surface of the sample 1. The sample 1 is vacuum chucked on the sample table 14. The sample table 14 is in turn mounted on stages 65, 64 and 63 that are moved respectively in the X, Y and Z directions by a stage driving apparatus 62.

In this setup, operating the stage driving apparatus 62 positions the sample 1 at a predetermined pitch while exposing it repeatedly. This operation forms a plurality of patterns on the top surface of the sample 1 at the predetermined pitch.

The position off the mirror 38 is measured by the laser interferometer 37. The measurements in turn provide the accurate position of the sample table 14. The position of the sample table 14 thus obtained is compared with a target position. The difference between the measured, and the target positions is fed back through the controller 39 to the stage driving apparatus 62. In this manner, once the target position against which to form the pattern is given, the sample table 14 is precisely positioned relative to that target position.

Figure 20:
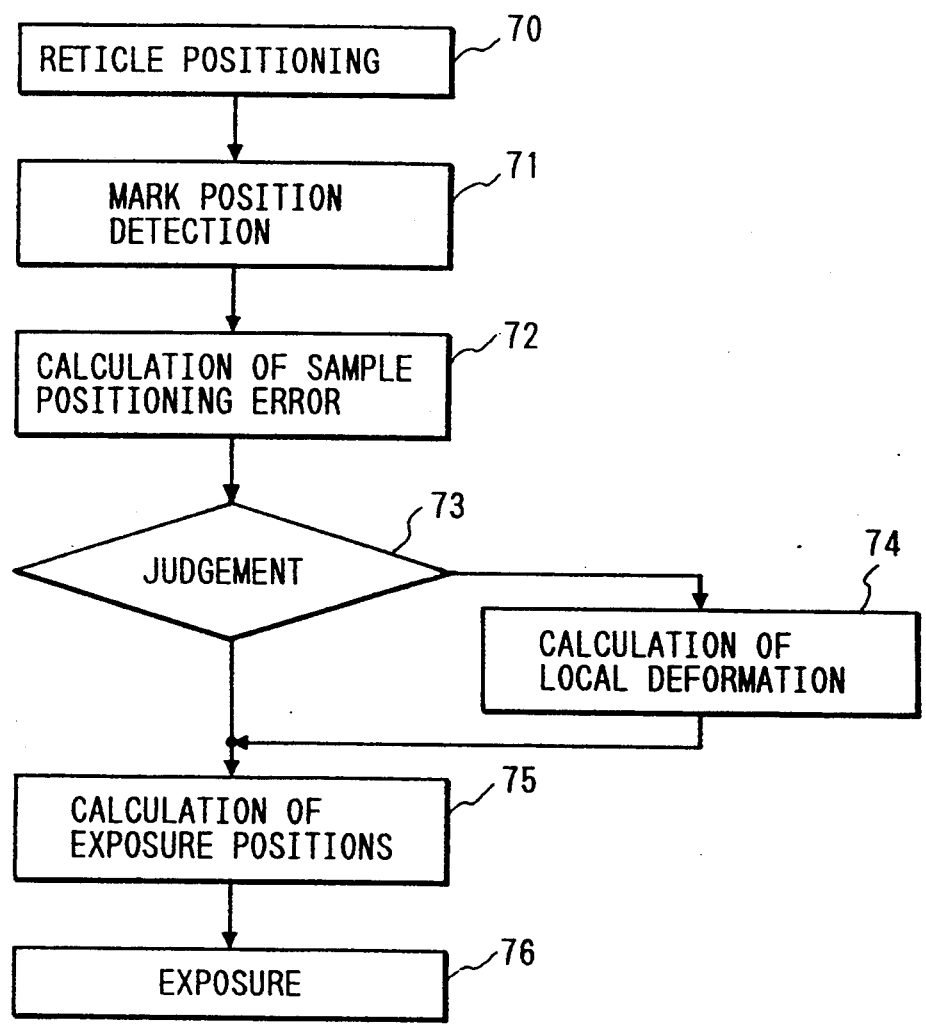
FIG. 20 is a view showing the alignment processes carried out in connect;ion with the pattern forming apparatus of FIG. 19.

Alignment of the reticle 31 with the sample 1 is accomplished by following the steps shown in FIG. 20. In step 70, the reticle 31 is positioned. Specifically, the reticle 31 is mounted on the file positioning reticle stage 40. The fine positioning wafer stage controller 39 fine-positions the stage 40 so as to align the center position of the reticle 31 with the optical axis of the exposure optics. In step 71, the positions of a plurality of position detection marks 2 on the bottom surface of the sample 1 are detected. That is, the mark position detector 19 fixedly attached to a base 66 detects the positions of the marks 2 through windows 80 on the sample table 14.

In step 72, position errors between a least two marks (in X and Y directions) are detected. The detected mark position errors are utilized by arithmetic means 61 in calculating the parallel movement error of the sample 1 on the sample table 14, the rotation error within the sample surface, and the homogeneous deformation inside the sample surface. Where mark position errors are detected from a larger number of position detection marks 2, these errors are statistically calculated so that the average chucking error composed of the parallel movement error, rotation error and homogeneous deformation will be obtain more accurately than ever. The calculation of the average chucking error are all carried out in step 72.

In step 73, a decision is made as to whether or not to acquire the amount of the local deformation in the sample 1. If the need to acquire the local deformation is recognized in step 73, step 74 is reached. Step 74 calculates the amount of the local deformation in the sample 1. Given above results of detection, step 75 calculates the exposure positions at which to form patterns on sample 1. Lastly, step 76 forms the patterns on the sample 1 through exposure while having the stage driving apparatus 62 consecutively position the sample 1 at each of the multiple forming positions calculated in the preceding steps.

Figure 21:
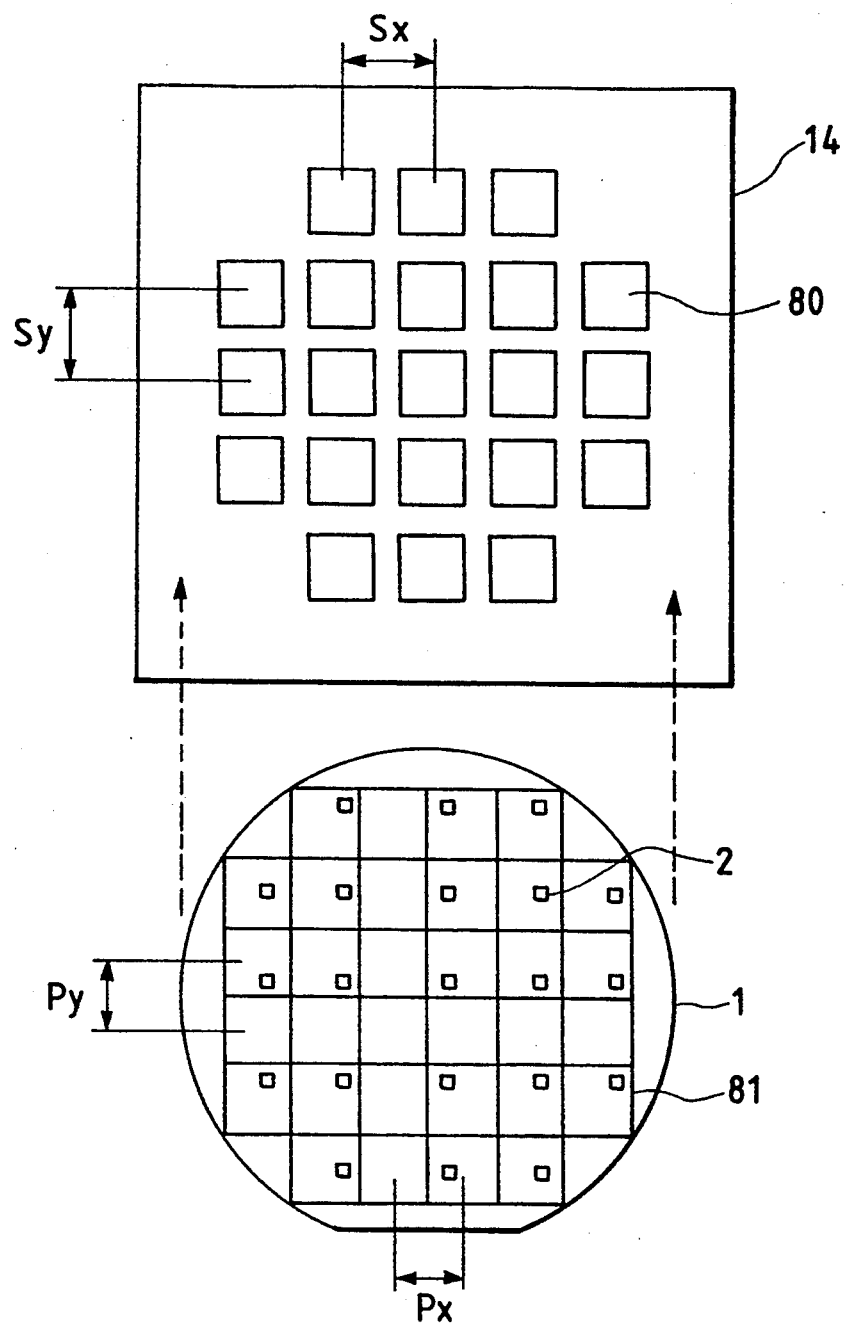
FIG. 21 is a view illustrating the arrangement; of windows 80 on the sample chucking surface of a sample table 14 with respect to position detection marks 2 on the sample bottom surface.

As depicted in FIG. 21, on the surface of the sample table 14 are a plurality of windows 80 whose pitches are represented by Sx and Sy in the X and Y directions, respectively. Between every two windows is a groove, not shown, for vacuum chucking the sample 1. On the other hand, the bottom surface of the sample 1 has position detection marks 2 arranged at the same pitches as the pitches Sx and Sy of the windows 80. This arrangement allows all position detection marks 2 on the bottom surface of the sample 1 to be directly observed from under the sample table 14 through the windows 80. In this case, it is not necessary to make the pitches (or chip sizes) Px and Py of multiple patterns 81 coincide with the pitches Sx and Sy of the marks 2 formed beforehand on the bottom surface of the sample 1. In this seventh embodiment, the position detection marks 2 are detected from the bottom surface of sample 1 at pitches Sx and Sy that are totally unrelated to the pitches Px and Py of the patterns 81 to be formed on the top surface of the sample 1. The resulting observations are used to obtain the chucking error of the sample 1 and the local deformation on the sample top surface. Thereafter, the position of each of the patterns 81 to be formed on the top surface of the sample 1 is calculated. In this manner, when the first layer patterns are to be exposed for production of a semiconductor integrated circuit, etc., the positions of the position detection marks 2 formed beforehand on the bottom surface of the sample 1 are detected.

With the seventh embodiment, the p:itches Sx and Sy of the windows 80 on the sample table 14 are both set for 25 mm. The windows 80 may contain a material that is transparent to the light for mark position detection (e.g., glass). Furthermore, the entire sample support section of the sample table. 14 may be made of a material transparent to the light for mark position detection. The vacuum chucking grooves may be omitted and, in their place, arrangements may be provided to secure the material in an electromagnetic manner.

Figure 22:
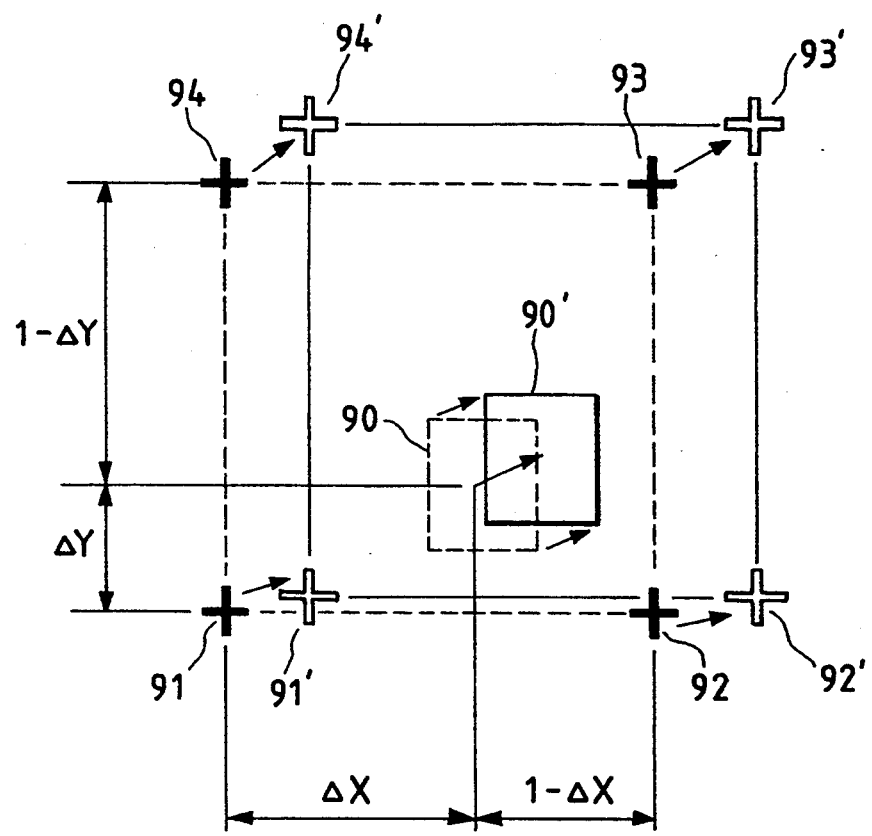
FIG. 22 is a view describing how the pattern forming position is calculated with the pattern forming apparatus of FIG. 19.

The position of each or the patterns 81 to be formed on the top surface of the sample 1 is calculated by the arithmetic means 61 shown in FIG. 19. One example of the calculations involved will now be described with reference to FIG. 22. Four marks, 91, 92, 93 and 94, are part of the many position detection marks 2 formed beforehand on the bottom surface of the sample 1. The four marks indicate the precisely aligned position of the sample 1 on the sample table 14.

The disposition pitches of these marks are Sx in the X direction ad Sy n the Y direction. Here, it is assumed that the four marks are displaced from their respective aligned positions due to a chucking error of the sample 1 and are detected at 91', 92', 93' and 94', with deviation amounts of $(X_1, Y_1)$, $(X_2, Y_2)$, $(X_3, Y_3)$ and $(X_4, Y_4)$, respectively.

One on the multiple patterns 81 to be formed on the top surface off the sample 1 is a pattern 90 indicated in broken by a broken line. The regular exposure position of the pattern 90 does not match ay of the four marks 91, 92, 93 and 94. As illustrated, the pattern 90 is located so that the mark pitch Sx in the X direction will be internally divided by a ratio of $\Delta x$ to 1-$\Delta x$ and so that the mark pitch Sy in the Y direction will be internally divided by a ratio of $\Delta y$ to 1-$\Delta y$.

The pitches of the patterns 81 to be formed on the top surface of the sample 1 are already known, and so are the pitches of the position detection marks 2 formed beforehand on the bottom surface of the sample 1. Thus when the position number of the pattern 90 is designated, the values of $\Delta x$ and $\Delta y$ are uniquely determined.

The actual exposure position 90′ of the pattern 90 is deviated by (X, Y) from the regular position, The deviation (X, Y) of the pattern position is given by the following equations involving the above-mentioned mark position deviations $(X_1, Y_1)$, $(X_2, Y_2)$, $(X_3, Y_3)$ and $(X_4, Y_4)$:

$$X = \{x_1(1-\Delta x)(1-\Delta y) + x_2 \Delta x(1-\Delta y) + x_3 \Delta x \Delta y + x_4(1-\Delta x)\Delta y\}/4 \quad (17)$$

$$Y = \{y_1(1-\Delta x)(1-\Delta y) + y_2 \Delta x(1-\Delta y) + y_3 \Delta x \Delta y + y_4(1-\Delta x)\Delta y\}/4 \quad (18)$$

The equations (17) and (18) above are linear approximation equations. It should be noted that these calculations are not limitative of what the arithmetic means 61 does. The arithmetic means 61 may also utilize the spline function and the like in calculating the results of position detection from a still larger number of position detection marks. Conversely, it is also possible to detect the positions of only those representative (at least two) of the many marks; to obtain there from the average parallel movement error, in-plane rotation error, etc. of the sample 1 placed on the sample table 14; and to calculate each exposure position thereby.

According to the invention, the position detection marks 2 are provided on the sample bottom surface where the patterns of semiconductor integrated circuits, etc., will not be formed. This eliminates the conventional chores of forming alignment mark patterns concurrently during the process of forming the desired patterns on the sample top surface, the mark patterns being required in the alignment process that follows. That is, that pattern to be printed which is written on the reticle 31 need not necessarily contain alignment mark patterns. Besides the stepper illustrated in FIG. 19, the X-ray exposure system or the electron beam lithography system may also operate effectively on the method of the invention in order to detect positions on the sample top surface.

In the above-described embodiments, the position detection marks on the sample bottom surface are two-dimensionally spaced at regular intervals in a Cartesian coordinate system. Alternatively, the position detection marks may also be arranged illustratively at irregular intervals for one-for-one correspondence with the windows 80. A further alternative is to arrange the position detection arks in a polar coordinate system. These alternatives all provide the same effects.

As described according to the invention, the position detection marks on the sample bottom surface are detected so as to find positions on the sample top surface. The measurements of the position detection marks are made to contain a deviation that varies with the tilt angle of the sample. The deviation is used to cancel the detection error $\epsilon$ resulting from the sample tilt angle. In this manner, the detection error $\epsilon$ caused by the tilted sample is virtually eliminated without the use of a separately provided tilt detecting means for detecting the sample tilt angle.

Also according to the invention, when the position detection marks on the sample bottom surface are detected, the resulting measurements are used to find the positioning error on the sample top surface. Then with the error taken into account, each position at which to form the pattern (of semiconductor integrated circuit, etc.) is calculated. This arrangement makes it possible to form patterns whose chip sizes are unrelated to the disposition pitches of the position detection marks. Because the sample table is provided with the mark position observation windows corresponding one-for-one to the position detection marks on the sample bottom surface, any position detection mark may be observed directly from the sample bottom side through the corresponding window.

As many apparently different embodiments of the present invention may be made without departing from the spirit and scope thereof, it is to be understood that the invention is not limited to the specific embodiments thereof except as defined in the appended claims.

What is claimed is:

1. A semiconductor wafer, comprising:
   a top surface on which a semiconductor circuit pattern is to be fabricated at a first predetermined pitch; and
   a bottom surface on which a plurality of alignment marks for positioning said semiconductor circuit pattern are arranged at a second predetermined pitch;
   wherein said second predetermined pitch is unrelated to the first predetermined pitch.

2. A semiconductor wafer according to claim 1, wherein said alignment marks are arranged two-dimensionally on said bottom surface.

3. A semiconductor wafer according to claim 1, wherein said top surface is a polished surface.

4. A method for fabricating a semiconductor wafer, comprising the steps of:
   preparing a semiconductor substrate having a top surface and a bottom surface; and
   forming a plurality of marks on said bottom surface in accordance with a desired arrangement for positioning a semiconductor circuit pattern to be formed on said top surface;
   wherein the desired arrangement has a predetermined pitch that is unrelated to a pitch of the semiconductor circuit pattern to be formed.

5. A method for fabricating a semiconductor wafer according to claim 4, wherein said alignment marks are arranged two-dimensionally on said bottom surface.

6. A method for fabricating a semiconductor wafer according to claim 4, further comprising a step of polishing said top surface.

7. A semiconductor wafer comprising:
   a top surface on which a plurality of semiconductor circuit chips are to be formed at a first predetermined pitch; and
   a bottom surface on which alignment marks for positioning said semiconductor chips are arranged at a second predetermined pitch;

wherein said second predetermined pitch differs from the first predetermined pitch.

8. A semiconductor wafer according to claim 7, wherein said alignment marks are arranged two-dimensionally on said bottom surface.

9. A semiconductor wafer comprising:
a top surface on which a plurality of semiconductor circuit chips are to be formed with a plurality of shot areas having a predetermined first arrangement; and
a bottom surface on which a plurality of alignment marks for positioning said plurality of shot areas are provided at a predetermined second arrangement;
wherein said second arrangement is unrelated to said first arrangement.

10. A semiconductor wafer according to claim 9, wherein said alignment marks are arranged two-dimensionally on said bottom surface.

11. A semiconductor wafer comprising:
a top surface on which a plurality of semiconductor circuit chips are to be formed with a plurality of shot areas having a predetermined first arrangement; and
a bottom surface on which a plurality of alignment marks for positioning said plurality of shot areas are provided at a predetermined second arrangement;
wherein said second arrangement differs from said first arrangement.

12. A semiconductor wafer according to claim 11, wherein said alignment marks are arranged two-dimensionally on said bottom surface.

13. A workpiece comprising:
a top surface on which a plurality of first patterns are to be formed with a plurality of shot areas having a predetermined first arrangement; and
a bottom surface on which a plurality of alignment marks for positioning said plurality of shot areas are provided at a predetermined second arrangement;
wherein said second arrangement is unrelated to said first arrangement.

14. A workpiece comprising:
a top surface on which a plurality of first patterns are to be formed with a plurality of shot areas having a predetermined first arrangement; and
a bottom surface on which a plurality of alignment marks for positioning said plurality of shot areas are provided at a predetermined second arrangement;
wherein said second arrangement differs from said first arrangement.

* * * * *